(12) United States Patent
Ninagawa

(10) Patent No.: US 11,562,730 B2
(45) Date of Patent: *Jan. 24, 2023

(54) ANC SYSTEM

(71) Applicant: Asahi Kasei Microdevices Corporation, Tokyo (JP)

(72) Inventor: Takashi Ninagawa, Tokyo (JP)

(73) Assignee: Asahi Kasei Microdevices Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 17/865,408

(22) Filed: Jul. 15, 2022

(65) Prior Publication Data

US 2022/0375450 A1 Nov. 24, 2022

Related U.S. Application Data

(62) Division of application No. 16/879,751, filed on May 20, 2020, now Pat. No. 11,488,572.

(30) Foreign Application Priority Data

May 22, 2019 (JP) .............................. JP2019-096057

(51) Int. Cl.
*G10K 11/178* (2006.01)
*H03K 5/1536* (2006.01)
*H03M 1/12* (2006.01)
*H03M 3/00* (2006.01)

(52) U.S. Cl.
CPC ..... *G10K 11/17881* (2018.01); *H03K 5/1536* (2013.01); *G10K 2210/1081* (2013.01); *G10K 2210/3016* (2013.01); *G10K 2210/3026* (2013.01); *G10K 2210/3027* (2013.01); *H03M 1/12* (2013.01); *H03M 3/458* (2013.01)

(58) Field of Classification Search
CPC ..... G10K 11/17881; G10K 2210/1081; G10K 2210/3016; G10K 2210/3026; G10K 2210/3027; H03K 5/1536; H03M 1/12; H03M 3/458
USPC .................................................. 381/71.6, 71.5
See application file for complete search history.

(56) References Cited

U.S. PATENT DOCUMENTS 9,230,532 B1 * 1/2016 Lu ..................... G10K 11/17855
2010/0128904 A1 * 5/2010 Hanna ..................... H04R 3/007
381/107

* cited by examiner

*Primary Examiner* — Vivian C Chin
*Assistant Examiner* — Douglas J Suthers
(74) *Attorney, Agent, or Firm* — JCIPRNET

(57) ABSTRACT

An ANC system is provided, including an AD converter performing an AD conversion on an external noise signal; an ANC signal generator generating an ANC signal for canceling a noise component arriving at ears of a user based on an output signal of the AD converter; a level detector detecting a level of the output signal and causes the ANC signal generator to power down in response to the level; and a zero-cross detector detecting a zero-cross timing of the ANC signal. The level detector starts measuring a time when the level is equal to or less than a first threshold value, and causes the ANC signal generator to perform a power down operation when the zero-cross timing is detected after the measured time exceeds the predetermined value, and causes the ANC signal generator to exit from the power down operation when the level exceeds a second threshold value.

5 Claims, 20 Drawing Sheets

ANC SYSTEM

CROSS REFERENCE TO RELATED APPLICATIONS

This application a division of U.S. Ser. No. 16/879,751 and claims the priority benefit of Japanese Patent Application No. 2019-096057, filed on May 22, 2019. The entirety of the above-mentioned patent application is hereby incorporated by reference herein and made a part of this specification.

BACKGROUND

Technical Field

The present disclosure relates to an active noise control (ANC) system.

Description of Related Art

There are feedforward-based ANC, feedback-based ANC, hybrid-based ANC, and the like as noise cancellation techniques of headphones and the like.

Feedback-based ANC is a technique of canceling out noise intruding from outside of a headphone by outputting, through a speaker, signals obtained by inverting the phases of noise signals collected using a noise microphone provided inside the headphone and performing feedback control. Although feedback-based ANC achieves excellent noise cancellation effects because feedback control is performed, it is necessary to consider oscillation due to a feedback loop.

Feedforward-based ANC is a technique of processing noise signals collected using a noise microphone provided outside a headphone such that the noise signals become signals having the same gains as those of noise signals intruding from the outside of the headphone and phases inverted from those of the intruding noise signals, outputting these signals through a speaker and canceling out noise near the ears. Although the feedforward type is less likely to oscillate and has high stability because there is no loop, high noise cancellation effects may not be obtained because users have different ear shapes.

hybrid-based ANC is a combination of the aforementioned feedback-based ANC and feedforward-based ANC. hybrid-based ANC can obtain better cancellation effects by canceling the remaining noise using feedback-based ANC after canceling noise by feedforward-based ANC.

FIG. 18 is a diagram showing a configuration example of a conventional feedforward-based ANC system disclosed in Patent Document 1 (Japanese Patent No. 4882773). In the conventional ANC system 20, noise arriving at the ears is cancelled by performing AD conversion on external noise through an AD converter 26, calculating sound that cancels a noise component arriving at the ears by an ANC signal generator 27, performing DA conversion by a DA converter 23 and generating a resultant signal through a speaker 24. When it takes a long time to perform AD conversion, a signal that cancels the noise does not keep up with external noise and thus the noise is not able to be completely cancelled. Accordingly, this system requires an AD converter having less conversion delay. As an AD converter having less delay, a pipelined AD converter is known.

FIG. 19 is a diagram showing a configuration diagram of a pipelined AD converter. The pipelined AD converter 26 includes four SubADs and three signal amplification stages (MDAC). A SubAD uses two generally used flash type AD converters. The pipelined AD converter 26 finally obtains a 15-bit digital output signal by summing outputs (5 bits, 4 bits, 5 bits and 5 bits) of the SubADs 1 to 4 using an encoder.

In addition, as another AD converter, a delta-sigma AD converter is known. FIG. 20 is a diagram showing a configuration example of a delta-sigma AD converter. The delta-sigma AD converter 26 is configured according to feedback through an integrator, an AD converter, and a DA converter. FIG. 20 shows an example of a configuration of the delta-sigma AD converter in which first-order delta-sigma AD converters are combined and cascaded in two stages in order to increase the resolution of an output signal $Y1(z)$ of the delta-sigma AD converter. Here, $X(z)$ is an input signal and $Y1(z)$ and $Y2(z)$ are output signals of analog parts. In addition, $Yout(z)$ is a final digital output signal on which digital operation processing has been performed such that a quantization error is canceled through digital filter stages $H1(z)$ and $H2(z)$ of a digital part. The delta-sigma AD converter 26 obtains differences between output signals and input signals, cumulatively adds the differences through integrators and performs feedback control such that the outputs of the integrators are minimized.

The integrator of the first stage generates a quantization error that is inevitably generated when an analog signal is converted into a digital signal. $Y2(z)$ is a signal obtained by performing AD conversion on the quantization error. Since the output signal $Yout(z)$ is a signal in which the quantization error has been canceled, the delta-sigma AD converter 26 can obtain a noise shaping effect (effect of sufficiently increasing a sampling frequency such that it becomes higher than the frequency of an input signal and modulating a spectral density of a quantization error such that it decreases in a low frequency band that is a signal band and increases in an outside-of-band high frequency band) and reduce the quantization error to improve accuracy.

When an ANC system is mounted in a battery driven product such as a headphone and the like, low power consumption of the ANC system is required in order to extend the battery life. However, conventional ANC systems usually operates with high power consumption.

SUMMARY

The present disclosure provides an ANC system capable of reducing power consumption.

According to one embodiment of the present disclosure, an ANC system includes An ANC (active noise control) system, comprising: an AD (analog-to-digital) converter which performs an AD conversion on an external noise signal; an ANC signal generator which generates an ANC signal for canceling a noise component arriving at ears of a user based on an output signal of the AD converter; a level detector which detects a level of the output signal and causes the ANC signal generator to power down in response to the level; and a zero-cross detector which detects a zero-cross timing of the ANC signal. The level detector starts measuring measures a time when for which the level is equal to or less than a predetermined first threshold value, and causes the ANC signal generator to perform a power down operation when the zero-cross timing is detected after the measured time exceeds the predetermined value, and causes the ANC signal generator to exit from the power down operation when the level exceeds a predetermined second threshold value.

DESCRIPTION OF THE EMBODIMENTS

Hereinafter, embodiments of the present disclosure will be described in detail with reference to the drawings.

(First Embodiment)

Figure 1:
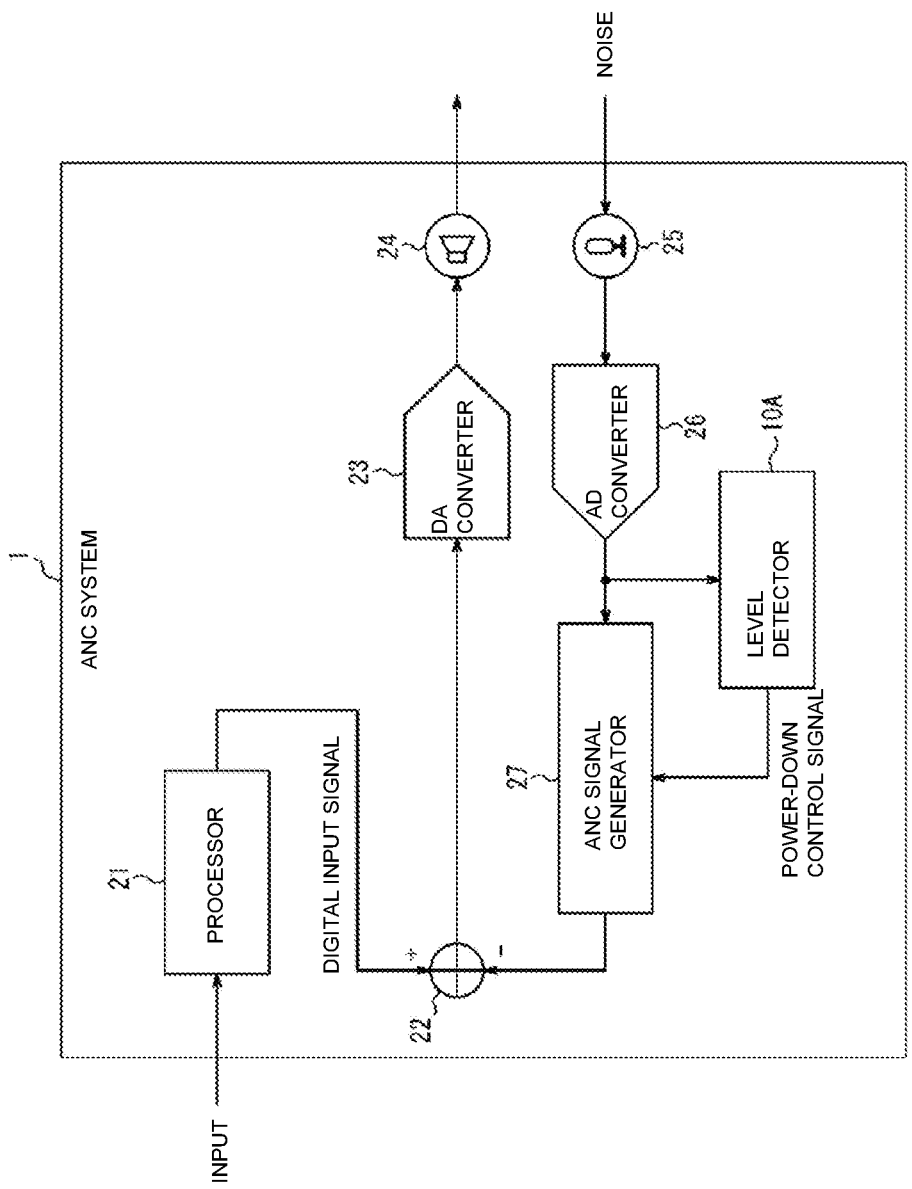
FIG. 1 is a diagram showing a configuration example of an ANC system according to a first embodiment of the present disclosure.
Figure 18:
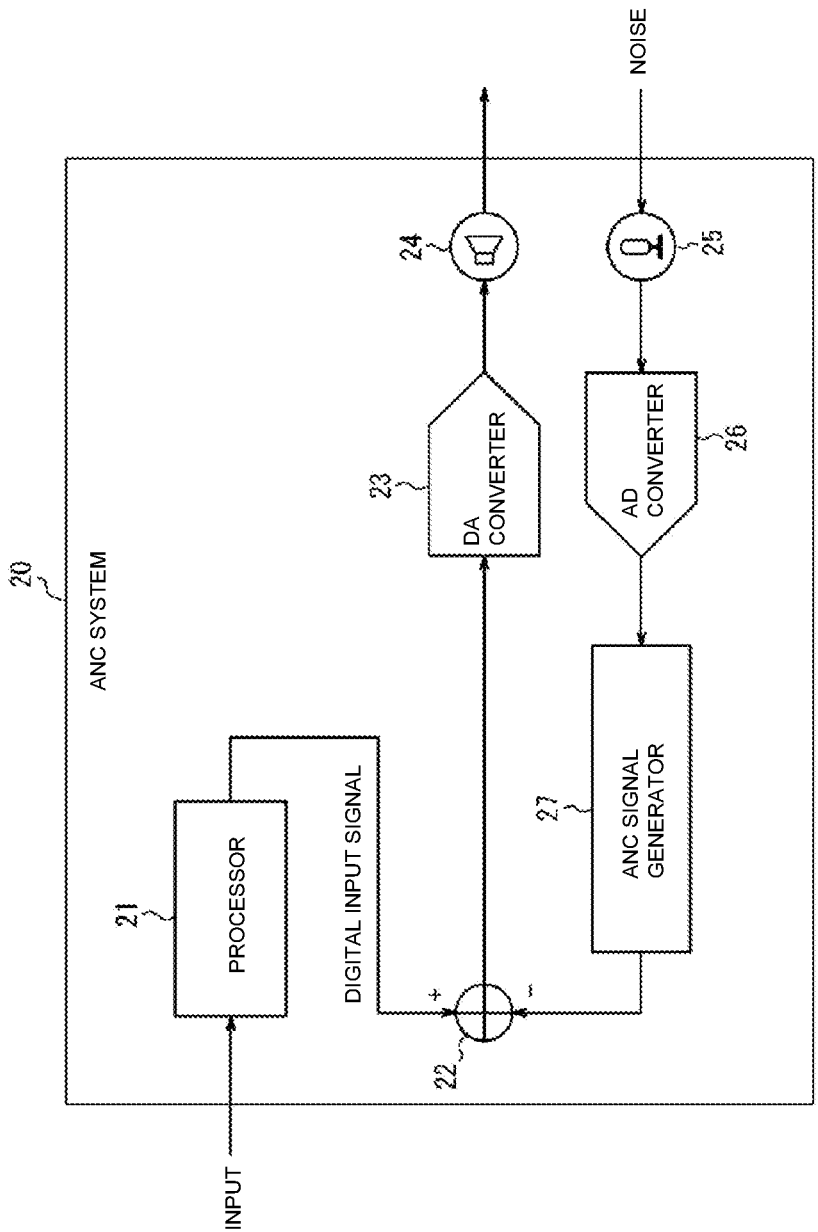
FIG. 18 is a diagram showing a configuration example of a conventional feedforward-based ANC system.

An ANC system according to a first embodiment of the present disclosure will be described below. FIG. 1 is a diagram showing a configuration diagram of the ANC system according to the first embodiment of the present disclosure. The ANC system 1 shown in FIG. 1 includes a processor 21, a subtractor 22, a DA converter 23, a speaker 24, a microphone 25, an AD converter 26, an ANC signal generator 27, and a level detector 10A. The ANC system 1 differs from the conventional ANC system 20 shown in FIG. 18 in that it further includes the level detector 10A.

The ANC system 1 is mounted in a headset such as a headphone or an earphone.

The processor 21 processes a signal input to the ANC system 1 to generate a digital input signal based on a user operation or the like and generates the digital input signal to the subtractor 22.

The AD converter 26 performs AD conversion on an external noise signal collected through the microphone 25 and generates the converted noise signal to the level detector 10A and the ANC signal generator 27.

The level detector 10A detects the output signal of the AD converter 26 and generates a power down control signal to the ANC signal generator 27. When the value (level) of the output signal of the AD converter 26 is equal to or less than a threshold value, the level detector 10A generates the power down control signal for causing the ANC signal generator 27 to power down to the ANC signal generator 27. In addition, when the value of the output signal of the AD converter 26 exceeds the threshold value, the level detector 10A generates the power down control signal for causing the ANC signal generator 27 to return from the power down operation to the ANC signal generator 27.

The ANC signal generator 27 performs digital processing on the output signal of the AD converter 26, generates a signal (ANC signal) for canceling noise components arriving at the ears of a user wearing the headset based on the output signal of the AD converter 26, and generates the ANC signal to the subtractor 22.

The subtractor 22 subtracts the ANC signal provided by the ANC signal generator 27 from the digital input signal provided by the processor 21, and generates a subtraction result to the DA converter 23.

The DA converter 23 converts a digital signal provided by the subtractor 22 into an analog signal, and generates the analog signal to the speaker 24.

Figure 2:
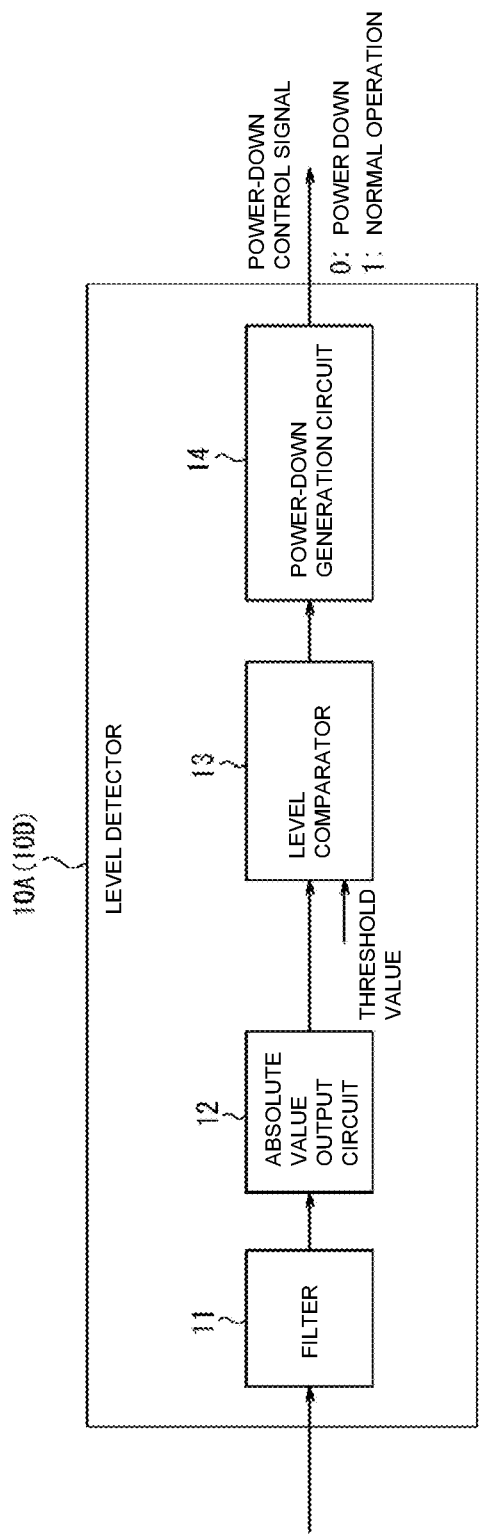
FIG. 2 is a diagram showing a configuration example of a level detector in the ANC system according to the first embodiment of the present disclosure.

A configuration of the level detector 10A will be described with reference to FIG. 2. FIG. 2 is a diagram showing a configuration example of the level detector 10A. The level detector 10A shown in FIG. 2 includes a filter 11, an absolute value output circuit 12, a level comparator 13, and a power down generation circuit 14.

The filter 11 removes quantization noise of the output signal of the AD converter and generates the output signal of the AD converter 26 from which the quantization noise has been removed to the absolute value output circuit 12. It is possible to suppress frequent switching between levels of the power down control signal generated by the level detector 10A due to the quantization noise by removing the quantization noise through the filter 11 before level detection.

The absolute value output circuit 12 obtains the absolute value of the signal provided by the filter 11 and generates the absolute value to the level comparator 13.

The level comparator 13 compares the value of the signal provided by the absolute value output circuit 12 with a predetermined threshold value and generates a signal representing a comparison result to the power down generation circuit 14.

The power down generation circuit 14 generates the power down control signal based on the signal provided by the level comparator 13 and generates the power down control signal to the ANC signal generator 27. Accordingly, the ANC signal generator 27 powers down in the case of a low noise environment and returns from the power down operation in the case of a high noise environment.

Figure 3:
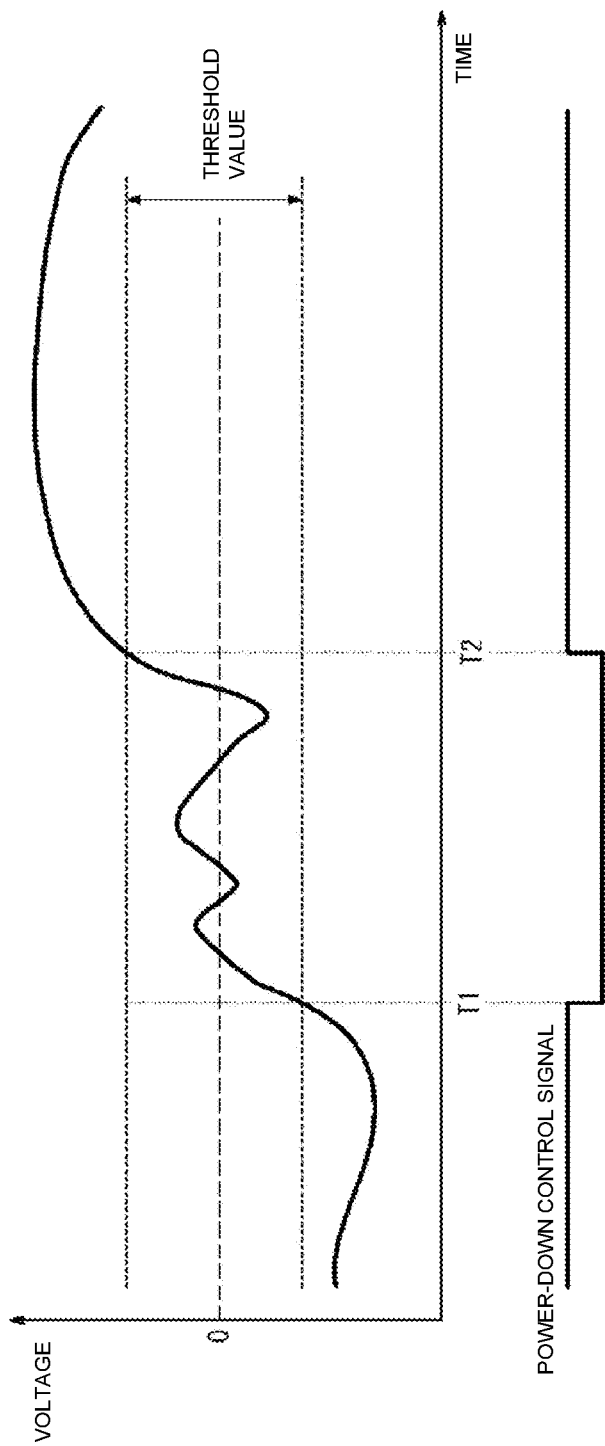
FIG. 3 is a diagram for describing power down control in the ANC system according to the first embodiment of the present disclosure.

Power down control of the ANC signal generator 27 according to the level detector 10A will be described with reference to FIG. 3. FIG. 3 shows the waveforms of an output signal of the AD converter 26 and the power down control signal.

(1) Transition from Normal Operation to Power Down Operation of ANC Signal Generator 27

The level comparator 13 compares a signal value provided by the absolute value output circuit 12 with the predetermined threshold value, and when the signal value provided by the absolute value output circuit 12 becomes equal to or less than the threshold value, generates a signal representing that the signal value has become equal to or less than the threshold value ("1" in the present embodiment). When the output of the level comparator 13 becomes "1," the power down generation circuit 14 switches the power down control signal from "1" to "0" at T1 in FIG. 3. In the present embodiment, the ANC signal generator 27 performs a normal operation when the power down control signal is "1" and performs a power down operation when the power down control signal is "0." Accordingly, the ANC signal generator 27 powers down at T1. The subtractor 22 outputs "0" during the power down operation of the ANC signal generator 27.

(2) Transition from Power Down Operation to Normal Operation of ANC Signal Generator 27

When the signal value provided by the absolute value output circuit 12 exceeds the threshold value during the power down operation of the ANC signal generator 27, the level comparator 13 generates a signal representing that the output value has exceeded the threshold value ("0" in the present embodiment). When the output of the level comparator 13 becomes "0," the power down generation circuit 14 switches the power down control signal from "0" to "1" at T2 in FIG. 3. Accordingly, the ANC signal generator 27 returns from the power down operation at T2.

As described above, the level detector 10A causes the ANC signal generator 27 to power down when the value of the output signal of the AD converter 26 is equal to or less than the threshold value and causes the ANC signal generator 27 to return from the power down operation when the value of the output signal of the AD converter 26 exceeds the threshold value in the present embodiment. According to such a configuration, the ANC system 1 can reduce power consumption. In addition, a noise level provided from the speaker 24 is improved because an external noise signal is provided to the subtractor 22 as "0" and noise from the AD converter 26 to the ANC signal generator 27 is not added during power down of the ANC signal generator 27.

(Second Embodiment)

Figure 4:
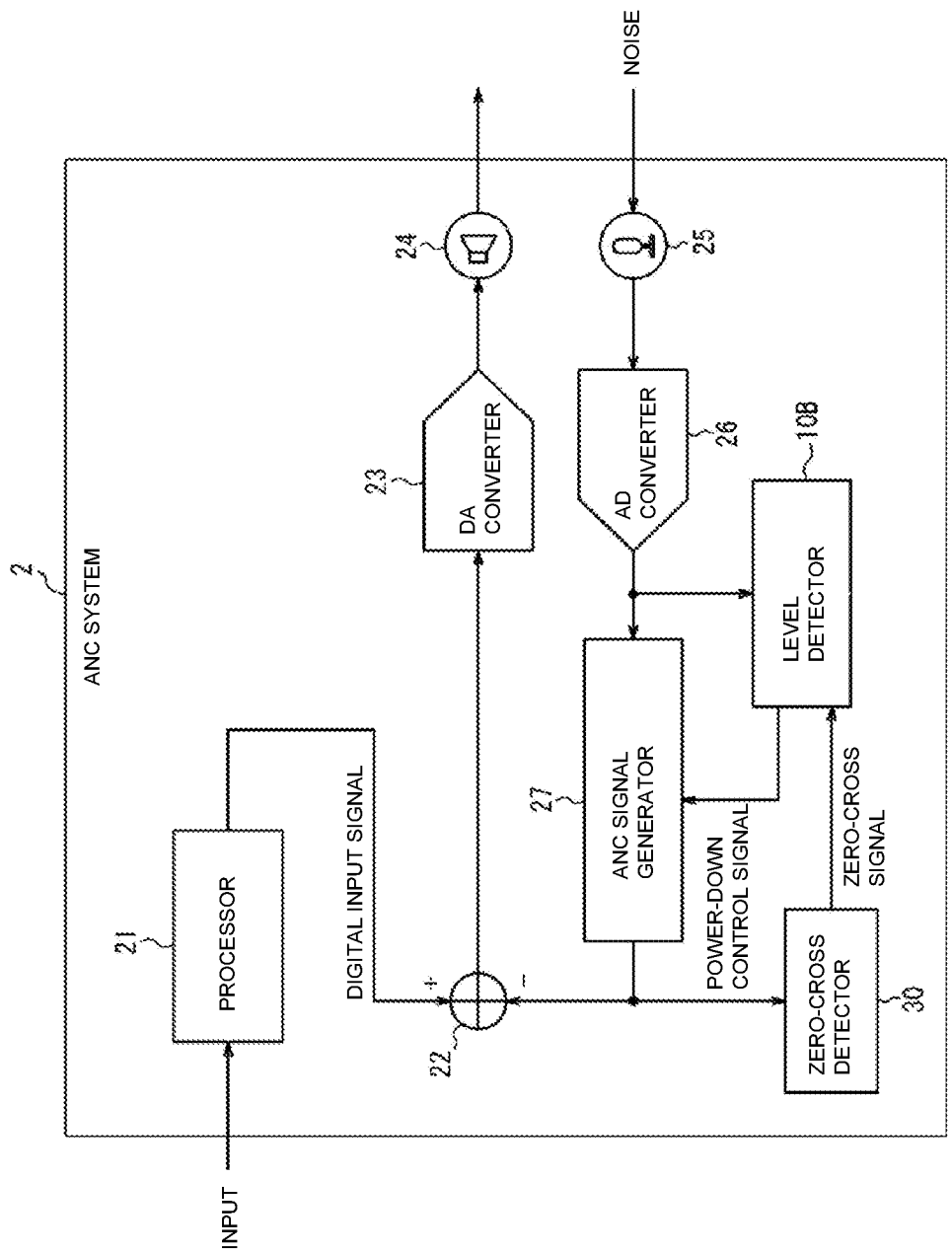
FIG. 4 is a diagram showing a configuration example of an ANC system according to a second embodiment of the present disclosure.

Next, an ANC system according to a second embodiment of the present disclosure will be described. FIG. 4 is a diagram showing a configuration example of the ANC system according to the second embodiment. The ANC system 2 shown in FIG. 4 includes a processor 21, a subtractor 22, a DA converter 23, a speaker 24, a microphone 25, an AD converter 26, an ANC signal generator 27, a level detector 10B, and a zero-cross detector 30. The ANC system 2 differs from the ANC system 1 of the first embodiment in that it further includes a zero-cross detector 30 and includes the level detector 10B instead of the level detector 10A. Other components are the same as those of the ANC system 1 of the first embodiment and thus are denoted by the same reference numerals and description thereof will be appropriately omitted.

The zero-cross detector 30 detects a zero-cross timing of an ANC signal provided by the ANC signal generator 27 and generates a zero-cross signal representing zero crossing to the level detector 10B.

When the value (level) of an output signal of the AD converter 26 is equal to or less than the threshold value, the level detector 10B generates the power down control signal for causing the ANC signal generator 27 to power down to the ANC signal generator 27 when the zero-cross signal is provided from the zero-cross detector 30. In addition, when the value of an output signal of the AD converter 26 exceeds the threshold value, the level detector 10B generates the power down control signal for causing the ANC signal generator 27 to return from the power down operation to the ANC signal generator 27.

Figure 5:
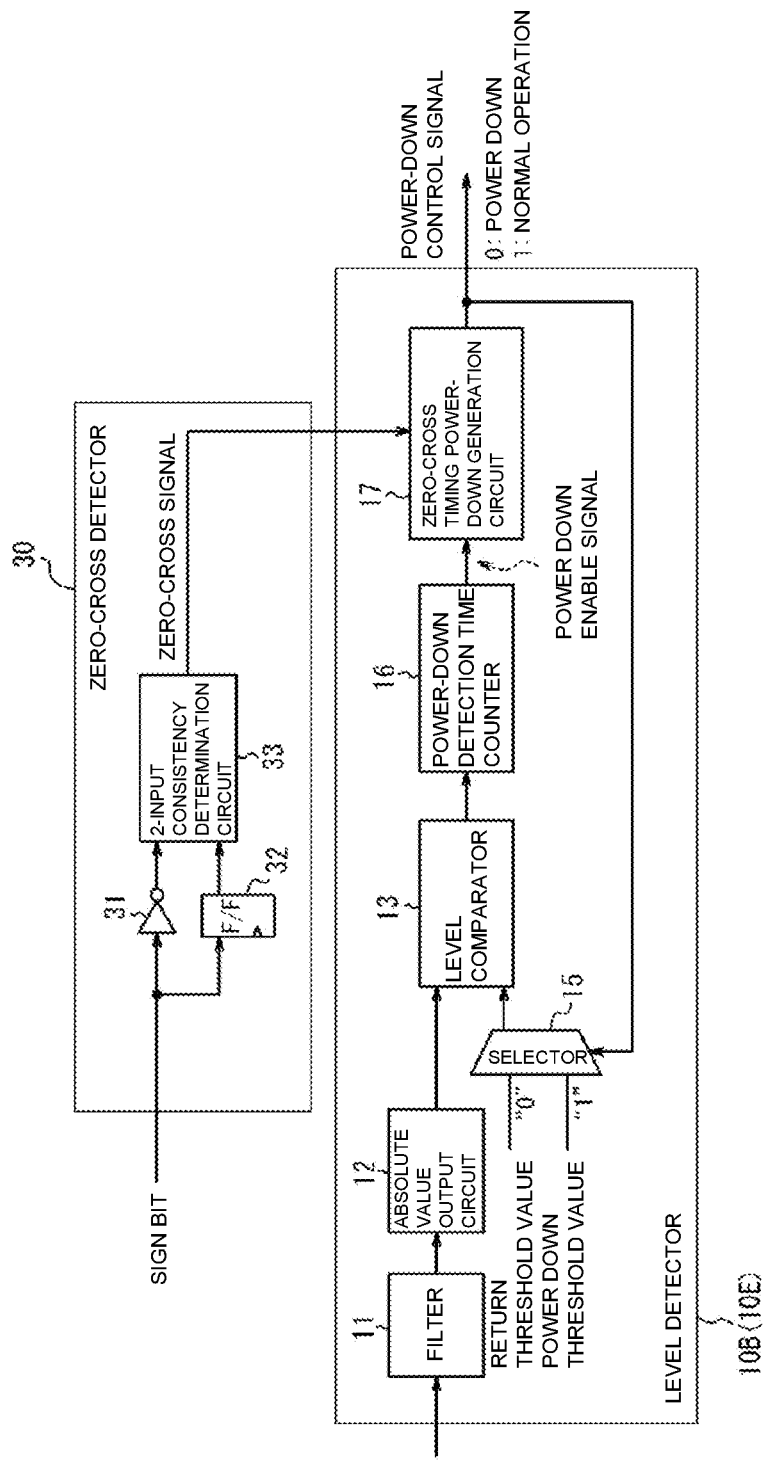
FIG. 5 is a diagram showing a configuration example of a level detector and a zero-cross detector in the ANC system according to the second embodiment of the present disclosure.

Configurations of the level detector 10B and the zero-cross detector 30 will be described with reference to FIG. 5. FIG. 5 is a diagram showing a configuration diagram of the level detector 10B and the zero-cross detector 30. The zero-cross detector 30 shown in FIG. 5 includes an inverting circuit 31, a flip-flop circuit 32, and a 2-input consistency determination circuit 33.

The inverting circuit 31 generates a signal obtained by inverting a sign bit of an ANC signal provided by the ANC signal generator 27 to the 2-input consistency determination circuit 33.

The flip-flop circuit 32 generates a sign bit one sample ahead of the sign bit of the ANC signal provided by the ANC signal generator 27 to the 2-input consistency determination circuit 33.

The 2-input consistency determination circuit 33 compares the signal obtained by inverting the sign bit of an ANC signal provided by the inverting circuit 31 with the sign bit one sample ahead of the sign bit of the ANC signal provided by the flip-flop circuit 32 and generates a zero-cross signal that is activated when the two values are consistent with each other to the level detector 10B.

The level detector 10B shown in FIG. 5 includes a filter 11, an absolute value output circuit 12, a level comparator 13, a selector 15, a power down detection time counter 16, and a zero-cross timing power down generation circuit 17.

The selector 15 generates a power down threshold value (first threshold value) to the level comparator 13 when the power down control signal is "1" and generates a return threshold value (second threshold value) to the level comparator 13 when the power down control signal is "0." By using threshold values having different magnitudes for the power down operation and the returning operation as threshold values provided to the level comparator 13, it is possible to perform a hysteresis operation and suppress the frequent switching between the power down operation and the returning operation due to insignificant environmental sound change. Meanwhile, the power down threshold value and the return threshold value can be controlled from the outside of the ANC system 2. Furthermore, the power down threshold value that is the first threshold value may be set to be the same as the return threshold value that is the second threshold value.

The level comparator 13 compares the value of a signal provided by the absolute value output circuit 12 with a threshold value provided by the selector 15 and generates a signal representing a comparison result to the power down detection time counter 16. In the present embodiment, the level comparator 13 generates "1" to the power down detection time counter 16 when the signal value provided by the absolute value output circuit 12 is equal to or less than the power down threshold value and generates "0" to the power down detection time counter 16 when the signal value provided by the absolute value output circuit 12 exceeds the return threshold value.

The power down detection time counter 16 starts counting when the output of the level comparator 13 becomes "1" and generates a power down enable signal that is activated when a counted value becomes equal to or greater than a power down detection time to the zero-cross timing power down generation circuit 17. Meanwhile, the power down detection time can be controlled from the outside of the ANC system 2.

That is, the level detector 10B detects the level of the output signal of the AD converter 26 and causes the ANC signal generator 27 to power down in response to the level. In addition, the level detector 10B measures a time for which the level is equal to or less than the predetermined first threshold value (power down threshold value), causes the ANC signal generator 27 to power down after the measured time exceeds a predetermined value, and causes the ANC signal generator 27 to return from the power down operation when the level exceeds the predetermined second threshold value (return threshold value).

The zero-cross timing power down generation circuit 17 generates the power down control signal based on the zero-cross signal provided by the zero-cross detector 30 and the power down enable signal provided by the power down detection time counter 16 and generates the power down control signal to the ANC signal generator 27. When the power down enable signal is activated, the level detector 10B causes the ANC signal generator 27 to power down when a zero-cross timing is detected. The level detector 10B causes the ANC signal generator 27 to power down when a zero-cross timing is detected after the measured time exceeds the predetermined value.

Figure 6:
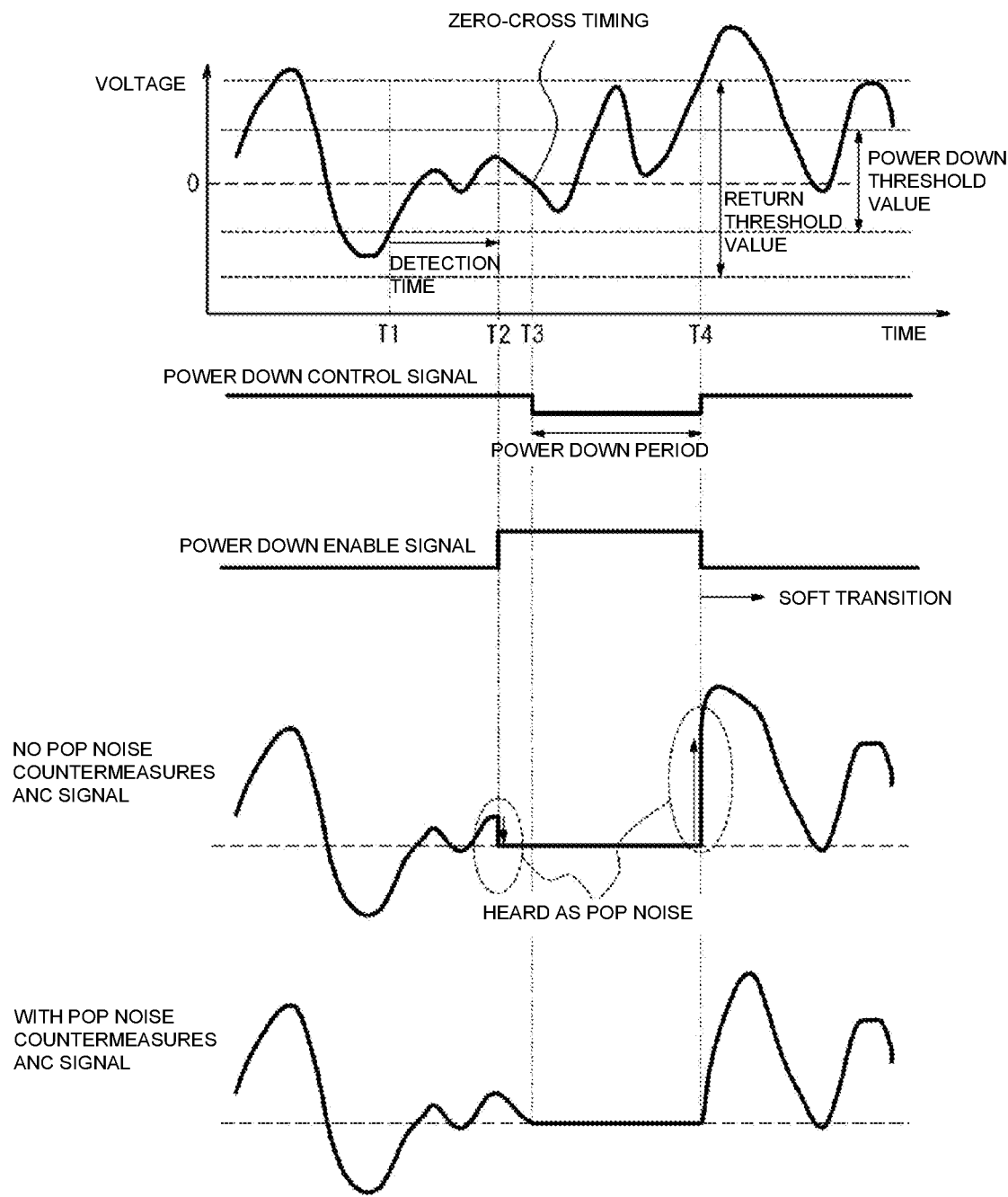
FIG. 6 is a diagram for describing power down control in the ANC system according to the second embodiment of the present disclosure.

Power down control of the ANC signal generator 27 according to the level detector 10B will be described with reference to FIG. 6. FIG. 6 shows the waveforms of the output signal of the AD converter 26, the power down control signal, the power down enable signal, and the output signal (ANC signal) of the ANC signal generator 27.

(1) Transition from Normal Operation to Power Down Operation of ANC Signal Generator 27

The level comparator 13 compares a signal value provided by the absolute value output circuit 12 with a threshold value selected by the selector 15 according to a power down control signal. Since the power down control signal during a normal operation is "1," the power down threshold value is provided by the selector 15. The level comparator 13 generates "1" when the signal value provided by the absolute value output circuit 12 becomes equal to or less than the power down threshold value at T1 in FIG. 6.

When the output of the level comparator 13 becomes "1," the power down detection time counter 16 starts counting. The power down detection time counter 16 activates the power down enable signal ("1" in the present embodiment) when a counted value reaches a set power down detection time at T2 in FIG. 6.

The zero-cross timing power down generation circuit 17 switches the power down control signal from "1" to "0" at a timing (T3 in FIG. 6) at which the zero-cross signal becomes "1" when the power down enable signal is "1." In the present embodiment, the ANC signal generator 27 performs the normal operation when the power down control signal is "1" and performs the power down operation when the power down control signal is "0." Accordingly, the ANC signal generator 27 powers down at T3. "0" is provided to the subtractor 22 during the power down operation of the ANC signal generator 27. Since the level detector 10B switches the ANC signal generator 27 to the power down operation after an elapse of the power down detection time, it is possible to suppress frequent mode switching between the normal operation and the power down operation when the output signal of the AD converter 26 varies near a threshold value of level detection.

(2) Transition from Power Down Operation to Normal Operation of ANC Signal Generator 27

When the power down control signal becomes "0" and the ANC signal generator 27 powers down, the return threshold value is provided by the selector 15. The return threshold value is assumed to be greater than the power down threshold value. The level comparator 13 outputs "0" when the signal value provided by the absolute value output circuit 12 exceeds the return threshold value. When the output of the level comparator 13 becomes "0," the power down detection time counter 16 sets the power down enable signal to "0" and the zero-cross timing power down generation circuit 17 switches the power down control signal from "0" to "1" at T4 in FIG. 6. Accordingly, the ANC signal generator 27 immediately returns from the power down operation.

As shown in FIG. 6, the ANC signal generator 27 may perform a soft transition (returning to an amplitude equal to or greater than the return threshold value at a set digital volume transition time) on the output signal when it returns from the power down operation. Accordingly, it is possible to carry out pop noise countermeasures. As shown in "no pop noise countermeasures" of FIG. 6, if countermeasures are not carried out during the transition between the normal operation and the power down operation, a step due to an abrupt level change is generated during switching and heard as pop up noise. In the present embodiment, it is possible to reduce pop noise and carry out operation transition by performing zero-cross processing at the time of switching from the normal operation to the power down operation and performing soft transition at the time of switching from the power down operation to the normal operation.

When the soft transition is performed, specifically, the ANC signal generator 27 includes a soft transition counter, a volume coefficient generation circuit, and a multiplier inside thereof. The soft transition counter starts counting when the AD converter 26 switches to the normal operation. The volume coefficient generation circuit generates a volume coefficient to the multiplier at counting intervals. The multiplier multiplies the output signal of the AD converter 26 by the volume coefficient to increase the signal level at the counting intervals. When the soft transition counter counts up to a predetermined value, the volume coefficient generation circuit generates a volume coefficient having a gain multiplied by one, and thus the output signal of the AD converter 26 is directly provided by the ANC signal generator 27.

As described above, in the present embodiment, the zero-cross detector 30 which detects a zero-cross timing of the ANC signal provided by the ANC signal generator is included and the level detector 10B causes the ANC signal generator 27 to power down if a zero-cross timing is detected when the value of the output signal of the AD converter 26 is equal to or less than the threshold value. According to such a configuration, the ANC system 2 can reduce the power consumption and decrease the auditory incompatibility of pop noise or noise variation generated during a transition to the power down operation of the ANC signal generator 27. In addition, since an external noise signal is provided to the subtractor 22 as "0" and noise from the AD converter 26 to the ANC signal generator 27 is not added during the power down of the ANC signal generator 27, a noise level provided by the speaker 24 is improved.

Furthermore, the ANC signal generator 27 may perform the soft transition when it returns from the power down operation. Accordingly, the ANC system 2 can reduce the auditory incompatibility of pop noise or noise variation generated during transition from the power down operation to the normal operation of the ANC signal generator 27.

(Third Embodiment)

Figure 7:
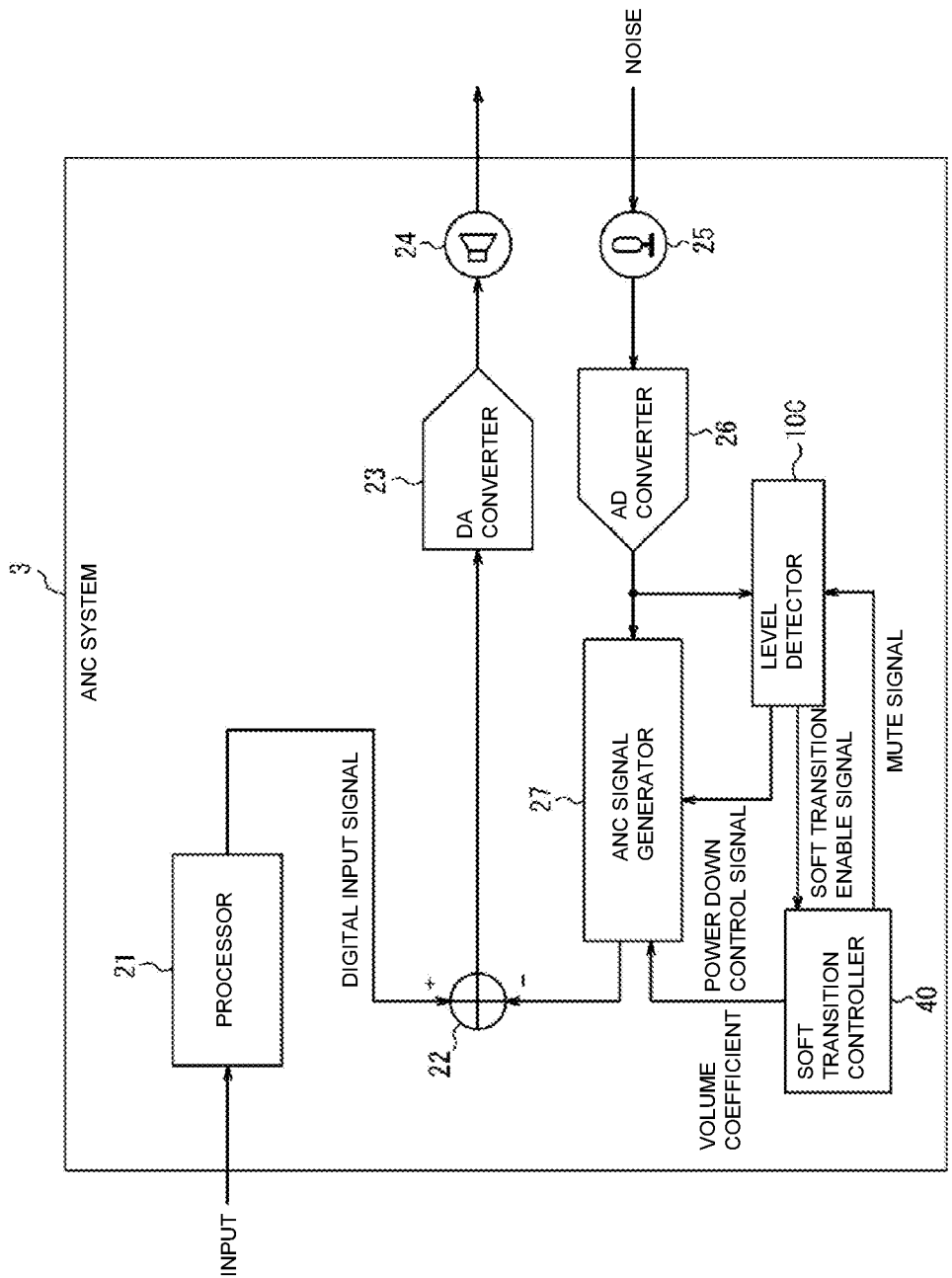
FIG. 7 is a diagram showing a configuration example of an ANC system according to a third embodiment of the present disclosure.

Next, an ANC system according to a third embodiment of the present disclosure will be described. FIG. 7 is a diagram showing a configuration example of the ANC system according to the third embodiment. The ANC system 3 shown in FIG. 7 includes a processor 21, a subtractor 22, a DA converter 23, a speaker 24, a microphone 25, an AD converter 26, an ANC signal generator 27, a level detector 10C, and a soft transition controller 40. The ANC system 3 differs from the ANC system 1 of the first embodiment in that it further includes the soft transition controller 40 and includes the level detector 10C instead of the level detector 10A. Other components are the same as those of the ANC system 1 of the first embodiment and thus are denoted by the same reference numerals and description thereof will be appropriately omitted. Meanwhile, the function of the soft transition controller 40 may be realized by the ANC signal generator 27.

The soft transition controller 40 causes the soft transition of the ANC signal provided by the ANC signal generator 27 while gradually changing a volume coefficient and outputs a mute signal to the level detector 10C when the output signal has attenuated to "0" (mute).

The level detector 10C detects the output signal of the AD converter 26 and generated the power down control signal to the ANC signal generator 27. In addition, the level detector 10C generates a soft transition enable signal representing a timing at which the soft transition will be performed to the soft transition controller 40.

Figure 8:
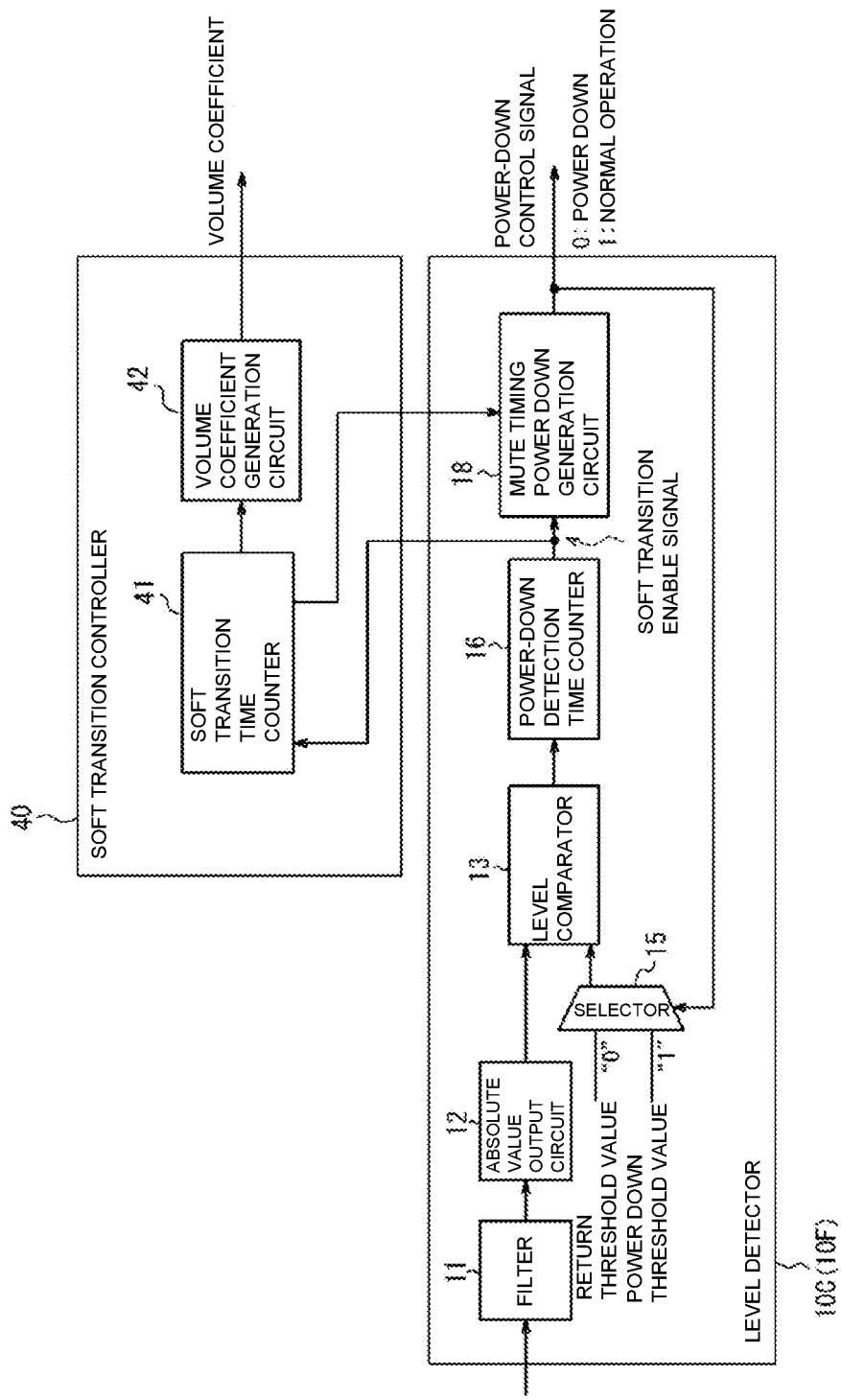
FIG. 8 is a diagram showing a configuration example of a level detector and a soft transition controller in the ANC system according to the third embodiment of the present disclosure.

Configurations of the level detector 10C and the soft transition controller 40 will be described with reference to FIG. 8. FIG. 8 shows a configuration example of the level detector 10C and the soft transition controller 40. The soft transition controller 40 shown in FIG. 8 includes a soft transition time counter 41 and a volume coefficient generation circuit 42.

The soft transition time counter 41 counts up to a predetermined value (soft transition time) when the soft transition enable signal provided by the level detector 10C becomes "1." The soft transition time can be set from the outside of the ANC system 3.

The volume coefficient generation circuit 42 generates a volume coefficient for attenuating the output signal of the ANC signal generator 27 to 0 over the soft transition time and generates the volume coefficient to the ANC signal generator 27 when the soft transition enable signal is "1." The volume coefficient generation circuit 42 updates the volume coefficient at counting intervals such that the output signal of the ANC signal generator 27 attenuates at a specific level.

The ANC signal generator 27 attenuates the output signal by multiplying the output signal of the AD converter 26 by the volume coefficient provided by the volume coefficient generation circuit 42.

The level detector 10C shown in FIG. 8 includes a filter 11, an absolute value output circuit 12, a level comparator 13, a selector 15, a power down detection time counter 16, and a mute timing power down generation circuit 18.

The power down detection time counter 16 performs counting when the output signal of the absolute value output circuit 12 is equal to or less than the power down threshold value and outputs a soft transition enable signal that is activated when the counted value becomes equal to or greater than a power down detection time to the mute timing power down generation circuit 18 and the soft transition controller 40.

The mute timing power down generation circuit 18 generates a power down control signal based on the soft transition enable signal provided by the power down detection time counter 16 and the mute signal provided by the soft transition time counter 41 and generates the power down control signal to the ANC signal generator 27.

When the soft transition enable signal is activated, the mute timing power down generation circuit 18 generates a power down control signal for causing the ANC signal generator 27 to power down to the ANC signal generator 27 when the mute signal is activated. In addition, when the signal value provided by the absolute value output circuit 12 is greater than the return threshold value, the mute timing power down generation circuit 18 generates a power down control signal for causing the ANC signal generator 27 to return from the power down operation to the ANC signal generator 27.

Figure 9:
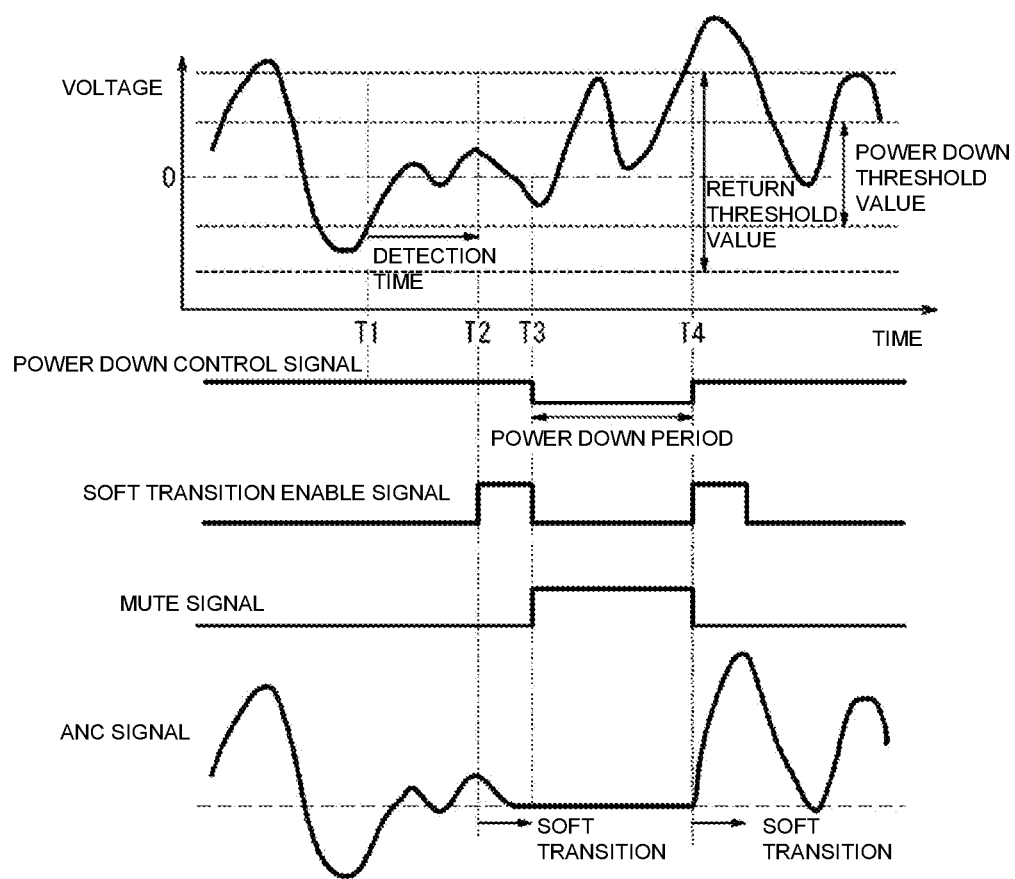
FIG. 9 is a diagram for describing power down control in the ANC system according to the third embodiment of the present disclosure.

Power down control of the ANC signal generator 27 according to the level detector 10C will be described with reference to FIG. 9. FIG. 9 shows the waveforms of the output signal of the AD converter 26, the power down control signal, the soft transition enable signal, the mute signal, and the output signal (ANC signal) of the ANC signal generator 27.

(1) Transition from Normal Operation to Power Down Operation of ANC Signal Generator 27

The operation from T1 to T2 in FIG. 9 is the same as that of the second embodiment and the soft transition enable signal is activated ("1" in the present embodiment) at T2. Then, the soft transition time counter 41 starts counting at T2. The volume coefficient generation circuit 42 updates the volume coefficient at counting intervals such that the ANC signal provided by the ANC signal generator 27 attenuates at a specific level. The soft transition time counter 41 counts up to a predetermined value (soft transition time) and the ANC signal generator 27 attenuates the ANC signal according to the volume coefficient. When the soft transition time has elapsed, the mute signal is activated ("1" in the present embodiment) (T3 in FIG. 9).

When the soft transition enable signal is "1," the mute timing power down generation circuit 18 switches the power down control signal from "1" to "0" at a timing at which the mute signal becomes "1." In the present embodiment, the ANC signal generator 27 performs the normal operation when the power down control signal is "1" and performs the power down operation when the power down control signal is "0." Accordingly, the ANC signal generator 27 powers down at T3. The subtractor 22 generates "0" during the power down operation of the ANC signal generator 27. Since the level detector 10C switches the ANC signal generator 27 to the power down operation after the power down detection time has elapsed, it is possible to suppress frequent mode switching between the normal operation and the power down operation when the output signal of the AD converter 26 varies near a threshold value of level detection.

(2) Transition from Power Down Operation to Normal Operation of ANC Signal Generator 27

The operation of transition from the power down operation to the normal operation of the ANC signal generator 27 is the same as that of the second embodiment and thus description thereof is omitted.

As described above, in the present embodiment, the soft transition controller 40 which causes soft transition of the ANC signal provided by the ANC signal generator 27 is included and the level detector 10C causes the ANC signal generator 27 to power down when the output signal of the ANC signal generator 27 attenuates to 0 when the value of the output signal of the AD converter 26 is equal to or less than the threshold value. According to such a configuration, the ANC system 3 can reduce the power consumption and decrease the auditory incompatibility of pop noise or noise variation generated during transition to the power down operation of the ANC signal generator 27. In addition, since an external noise signal is provided to the subtractor 22 as "0" and noise from the AD converter 26 to the ANC signal generator 27 is not added during power down of the ANC signal generator 27, a noise level provided by the speaker 24 is improved. That is, the level detector 10C causes the ANC signal generator 27 to power down when the ANC signal attenuates to a predetermined level according to the soft transition after a measured time exceeds a predetermined value.

Furthermore, the soft transition controller 40 may perform the soft transition at the time of returning from the power down operation. Accordingly, the ANC system 3 can reduce the auditory incompatibility of pop noise or noise variation generated during a transition from the power down operation to the normal operation of the ANC signal generator 27.

(Fourth Embodiment)

Figure 10:
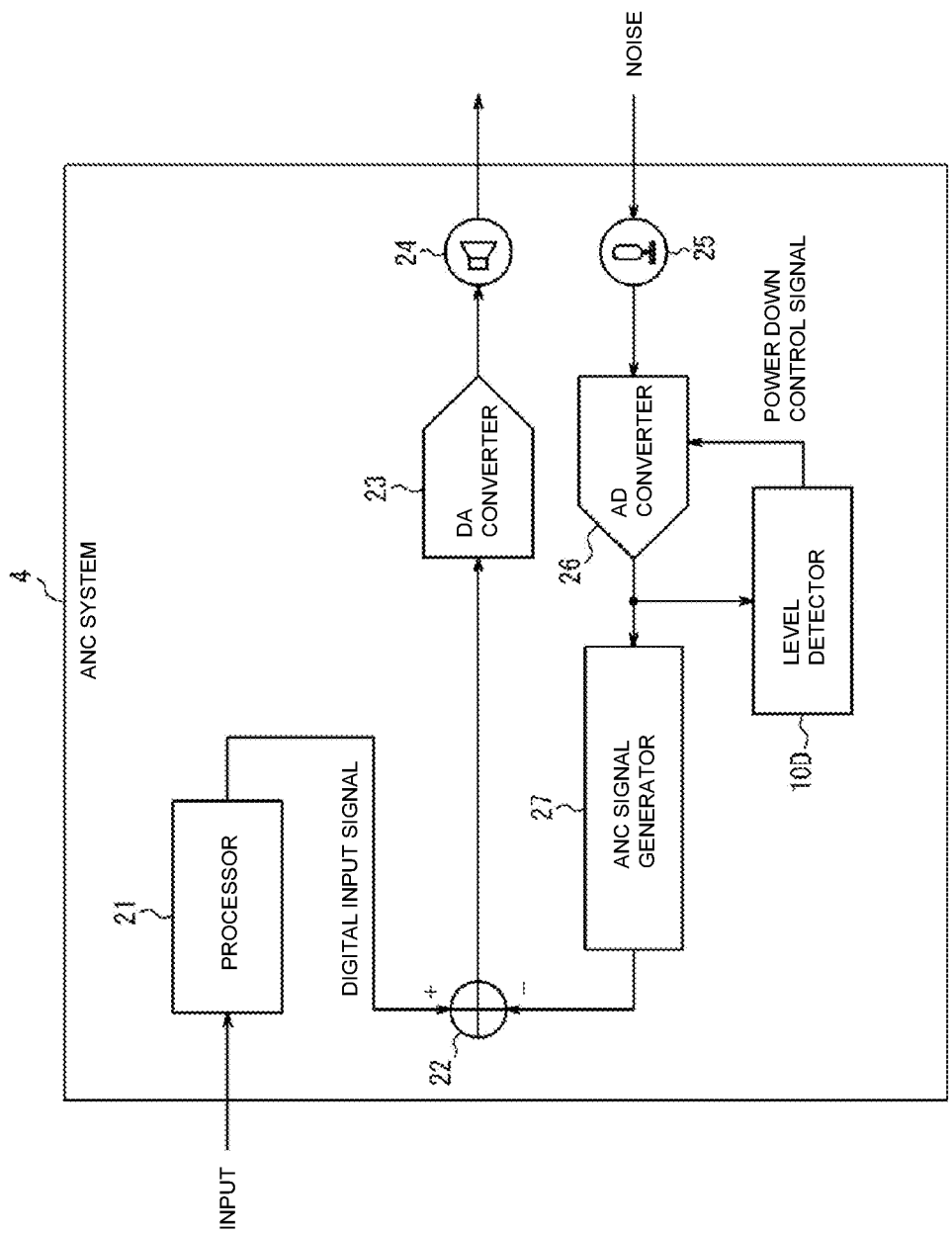
FIG. 10 is a diagram showing a configuration example of an ANC system according to a fourth embodiment of the present disclosure.
Figure 19:
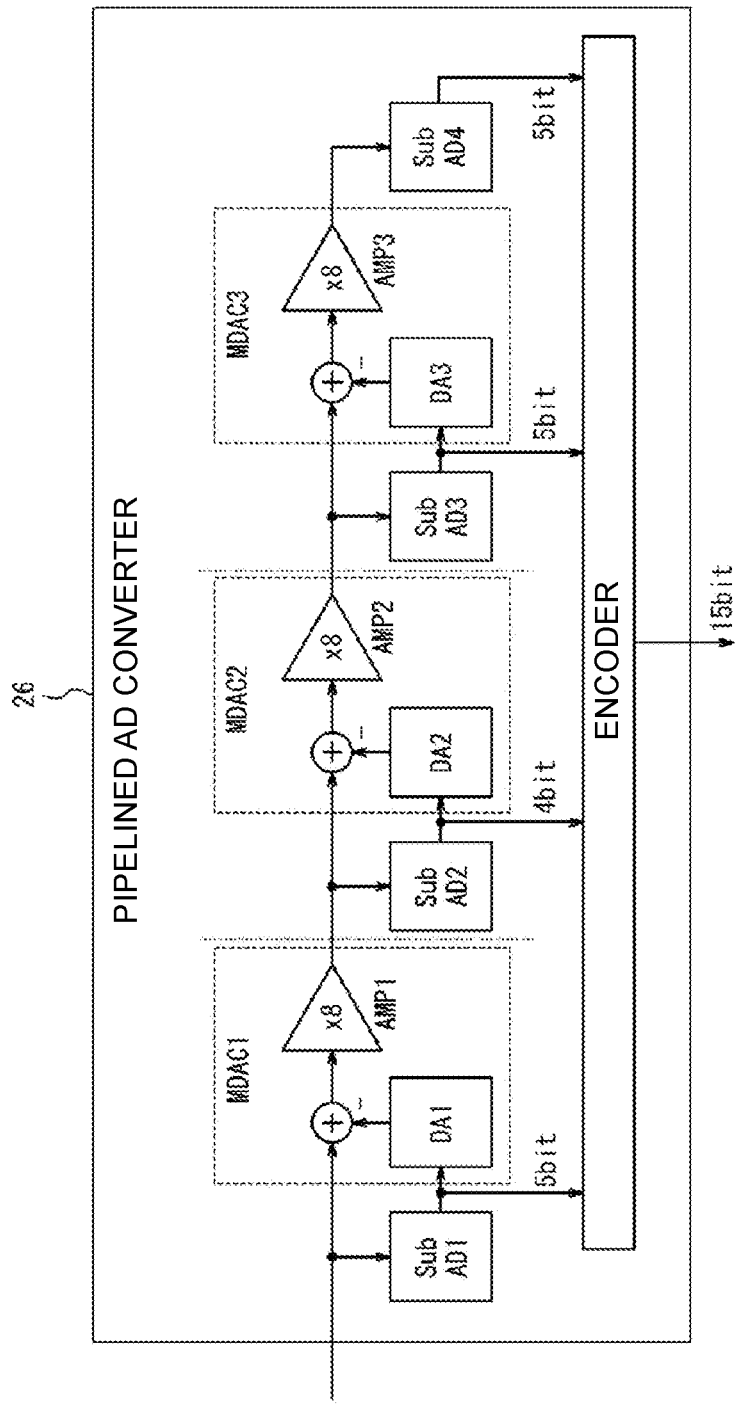
FIG. 19 is a diagram showing a configuration example of a pipelined AD converter.

Next, an ANC system according to a fourth embodiment of the present disclosure will be described. FIG. 10 is a diagram showing a configuration example of the ANC system according to the fourth embodiment. The ANC system 4 shown in FIG. 10 includes a processor 21, a subtractor 22, a DA converter 23, a speaker 24, a microphone 25, an AD converter 26, an ANC signal generator 27, and a level detector 10D. The ANC system 4 differs from the ANC system 1 of the first embodiment in that it includes the level detector 10D instead of the level detector 10A. Other components are the same as those of the ANC system 1 of the first embodiment and thus are denoted by the same reference numerals and description thereof is appropriately omitted. In addition, in the present embodiment, the AD converter 26 is called a pipelined AD converter 26 since the AD converter 26 has the configuration of the pipeline type shown in FIG. 19.

That is, the level detector 10D detects the level of the output signal of the AD converter 26 and causes the ANC signal generator 27 to power down in response to the level. In addition, the level detector 10D measures a time for which the level is equal to or less than a predetermined first threshold value (power down threshold value), causes a portion of blocks of the ANC signal generator 27 to power down after the measured time exceeds a predetermined value, and when the level exceeds a predetermined second threshold value (return threshold value), causes the ANC signal generator 27 to return from the power down. Further, the power down threshold value that is the first threshold valued may be set to be the same as the return threshold value that is the second threshold value.

The level detector 10D receives the output signal of the pipelined AD converter 26. Then, the level detector 10D generates a power down control signal for causing blocks which calculate lower bits in the pipelined AD converter 26 to power down after the measured time exceeds the predetermined value to the pipelined AD converter 26. In addition, the level detector 10D generates a power down control signal for causing the pipelined AD converter 26 to return from the lower bit power down operation when the output signal of the pipelined AD converter 26 exceeds a threshold value to the pipelined AD converter 26. Meanwhile, the level detector 10D may receive the input signal of the pipelined AD converter 26.

A configuration of the level detector 10D will be described with reference to FIG. 2 used in the first embodiment.

The filter 11 removes quantization noise of the output signal of the pipelined AD converter 26 and generates the signal from which the quantization noise has been removed to the absolute value output circuit 12. By removing the quantization noise using the filter 11 before level detection, it is possible to suppress the frequent switching between levels of the power down control signal provided by the level detector 10D due to the quantization noise.

The absolute value output circuit 12 obtains the absolute value of the signal provided by the filter 11 and generates the absolute value to the level comparator 13.

The level comparator 13 compares the value of the signal provided by the absolute value output circuit 12 with a predetermined threshold value and generates a signal representing a comparison result to the power down generation circuit 14.

The power down generation circuit 14 generates a power down control signal based on the signal provided by the level comparator 13 and generates the power down control signal to the pipelined AD converter 26.

Figure 11:
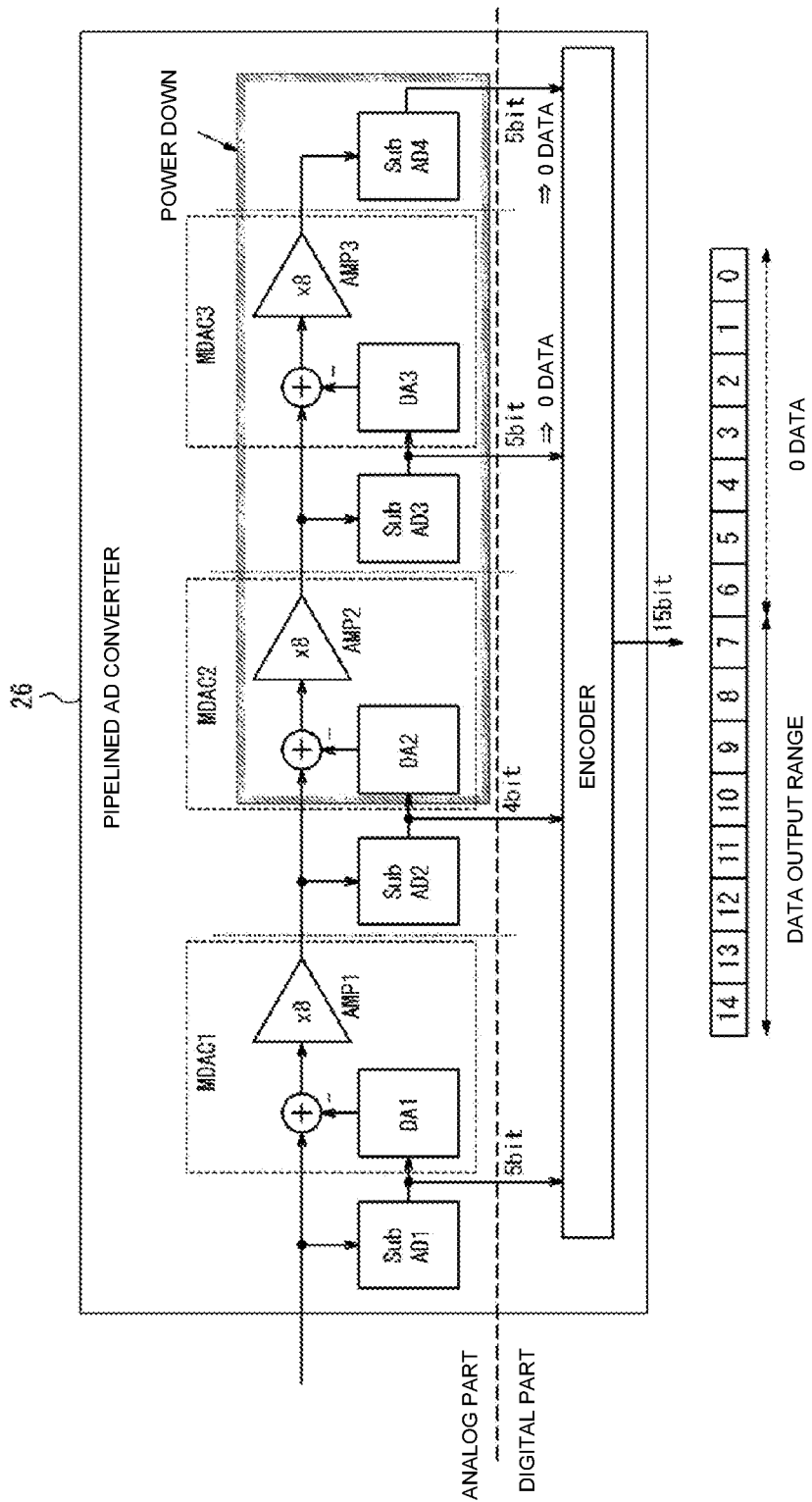
FIG. 11 is a diagram showing an example of power down of an AD converter in the ANC system according to the fourth embodiment of the present disclosure.

FIG. 11 is a diagram showing an example of power down of the pipelined AD converter 26. In the present embodiment, the pipelined AD converter 26 powers down (partially powers down) MDAC2, MDAC3, SubAD3, and SubAD4 that are blocks for calculating lower bits of a digital signal and generates only upper bits during power down, as shown in FIG. 11. In FIG. 11, lower 7 bits become 0 and upper 8 bits falls into a data output range among a 15-bit signal provided by an encoder during power down of the pipelined AD converter 26.

Power down control of the pipelined AD converter 26 according to the level detector 10D will be described with reference to FIG. 3 used in the first embodiment.

(1) Transition from Normal Operation to Power Down Operation of Pipelined AD Converter 26

The level comparator 13 compares a signal value provided by the absolute value output circuit 12 with a predetermined threshold value, and when the signal value provided by the absolute value output circuit 12 becomes equal to or less than the threshold value, generates a signal representing that the signal value becomes equal to or less than the threshold value ("1" in the present embodiment). When the output of the level comparator 13 becomes "1," the power down generation circuit 14 switches the power down control signal from "1" to "0" at T1 in FIG. 3. In the present embodiment, the pipelined AD converter 26 performs the normal operation when the power down control signal is "1" and performs the power down operation when the power down control signal is "0." Accordingly, the pipelined AD converter 26 powers down at T1. The pipelined AD converter 26 operates only SubAD1, SubAD2, and MDAC1 and powers down the subsequent stages in the power down state, as shown in FIG. 11. Further, the pipelined AD converter 26 may power down a digital part subsequent to the encoder within a range in which level detection can be performed.

(2) Transition from Power Down Operation to Normal Operation of Pipelined AD Converter 26

When the pipelined AD converter 26 powers down, it generates a signal of upper 8 bits among 15 bits. When the signal value provided by the absolute value output circuit 12 exceeds the threshold value during power down of the pipelined AD converter 26, the level comparator 13 generates a signal representing that the output value exceeds the threshold value ("0" in the present embodiment). When the output of the level comparator 13 becomes "0," the power down generation circuit 14 switches the power down control signal from "0" to "1" at T2 in FIG. 3. Accordingly, the pipelined AD converter 26 returns from the power down operation at T2.

Although processing stages corresponding to lower 7 bits are powered down in the present embodiment, if a conversion range of the lower 7 bits is greater than a threshold value, the conversion range of the lower 7 bits needs to be less than the return threshold value because the returning cannot be performed at a timing at which the lower 7 bits are fixed to 0 data and an input signal exceeds the threshold value. Meanwhile, in the present embodiment in which the lower 7 bits among the 15-bit digital output signal are powered down and level detection determination is performed on the signal of the upper 8 bits, as shown in FIG. 11, a configuration in which upper data is operated and threshold value determination is performed thereon is suitable for a system for inputting large signals to an AD conversion system or increasing a gain.

As described above, the level detector 10D causes the blocks which calculate lower bits in the pipelined AD converter 26 to power down when the value of the output signal of the pipelined AD converter 26 is equal to or less than the threshold value and causes the pipelined AD converter 26 to return from the lower bit power down operation when the value of the output signal of the pipelined AD converter 26 exceeds the threshold value in the present embodiment. According to the configuration of the present embodiment, it is possible to power down circuit elements other than circuit elements capable of generating the levels equal to or greater than the return threshold value of the level detector 10D such that level detection can be performed in various noise environments. Accordingly, the ANC system 4 can reduce the power consumption.

(Fifth Embodiment)

Figure 12:
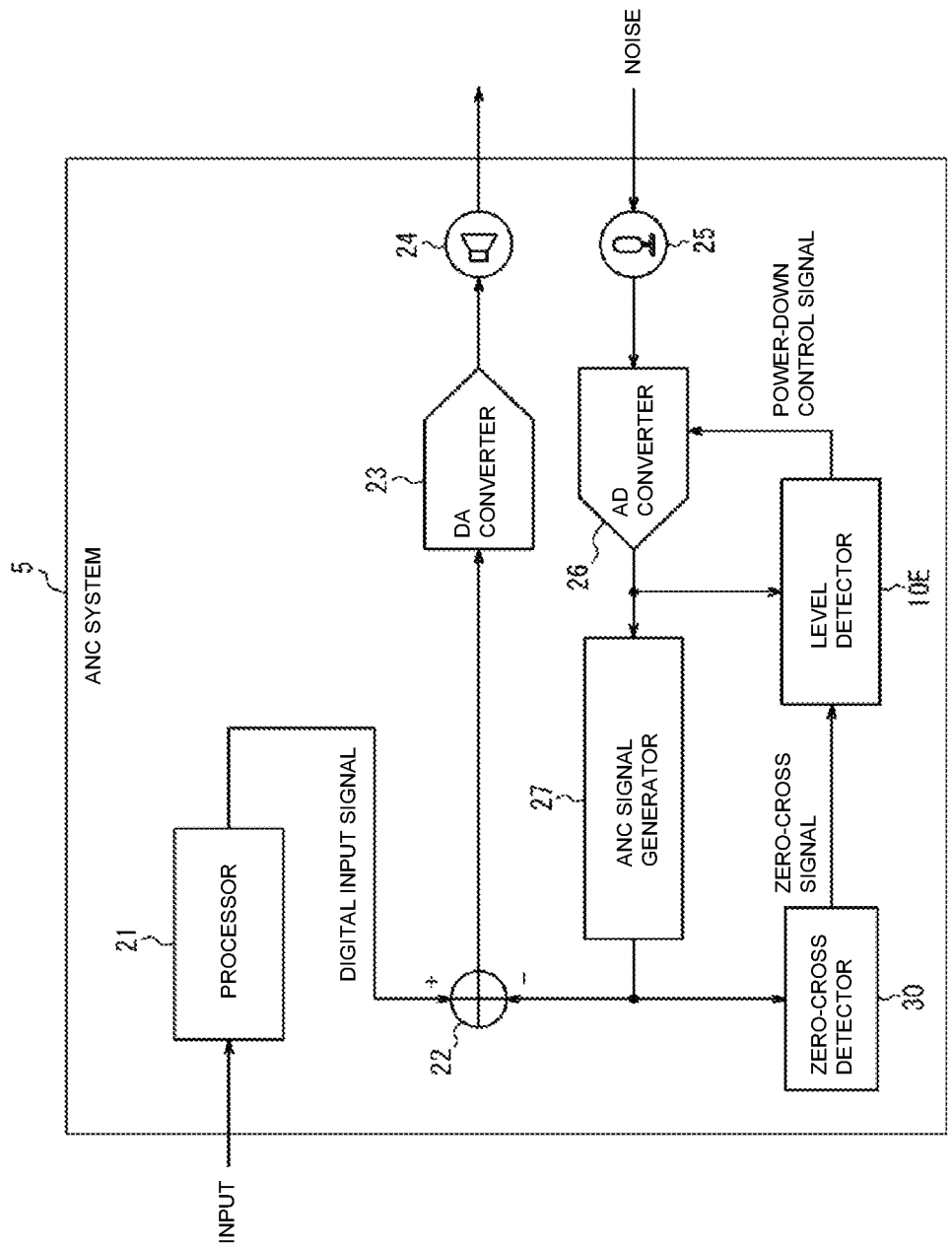
FIG. 12 is a diagram showing a configuration example of an ANC system according to a fifth embodiment of the present disclosure.

Next, an ANC system according to a fifth embodiment of the present disclosure will be described. FIG. 12 is a diagram showing a configuration example of the ANC system according to the fifth embodiment. The ANC system 5 shown in FIG. 12 includes a processor 21, a subtractor 22, a DA converter 23, a speaker 24, a microphone 25, an AD converter 26, an ANC signal generator 27, a level detector 10E, and a zero-cross detector 30. The ANC system 5 differs from the ANC system 1 of the first embodiment in that it further includes a zero-cross detector 30 and includes the level detector 10E instead of the level detector 10A. Other components are the same as those of the ANC system 1 of the first embodiment and thus are denoted by the same reference numerals and description thereof is appropriately omitted. In addition, in the present embodiment, the AD converter 26 is called a pipelined AD converter 26 because the AD converter 26 has the configuration of the pipeline type shown in FIG. 19.

Configurations of the level detector 10E and the zero-cross detector 30 will be described with reference to FIG. 5 used in the second embodiment.

The inverting circuit 31 generates a signal obtained by inverting a sign bit of an ANC signal provided by the ANC signal generator 27 to the 2-input consistency determination circuit 33.

The flip-flop circuit 32 generates a sign bit one sample ahead of the sign bit of the ANC signal provided by the ANC signal generator 27 to the 2-input consistency determination circuit 33.

The 2-input consistency determination circuit 33 compares the signal obtained by inverting the sign bit of an ANC signal provided by the inverting circuit 31 with the sign bit one sample ahead of the sign bit of the ANC signal provided by the flip-flop circuit 32 and generates a zero-cross signal that is activated when the two values are consistent with each other to the level detector 10E.

The selector 15 provides the power down threshold value to the level comparator 13 when the power down control signal is "1" and provides the return threshold value to the level comparator 13 when the power down control signal is "0." By using threshold values having different magnitudes for the power down operation and the returning operation as threshold values provided to the level comparator 13, it is possible to perform a hysteresis operation and suppress the frequent switching between the power down operation and the returning operation due to insignificant environmental sound change. Meanwhile, the power down threshold value and the return threshold value can be controlled from the outside of the ANC system 5.

The level comparator 13 compares the value of a signal provided by the absolute value output circuit 12 with a threshold value provided by the selector 15 and generates a signal representing a comparison result to the power down detection time counter 16. In the present embodiment, the level comparator 13 generates "1" when the signal value provided by the absolute value output circuit 12 is equal to or less than the power down threshold value and outputs "0" when the signal value provided by the absolute value output circuit 12 exceeds the return threshold value.

The power down detection time counter 16 starts counting when the output of the level comparator 13 becomes "1" and generates a power down enable signal that is activated when a counted value becomes equal to or greater than a power down detection time to the zero-cross timing power down generation circuit 17. Meanwhile, the power down detection time can be controlled from the outside of the ANC system 5.

The zero-cross timing power down generation circuit 17 generates a power down control signal based on the zero-cross signal provided by the zero-cross detector 30 and the power down enable signal provide by the power down detection time counter 16 and generates the power down control signal to the pipelined AD converter 26. That is, when the power down enable signal is activated, the pipelined AD converter 26 is powered down when a zero-cross timing is detected. The zero-cross detector 30 detects a zero-cross timing of the ANC signal, and when a zero-cross timing is detected after a measured time exceeds a predetermined value, a portion of blocks of the AD converter 26 are powered down.

The pipelined AD converter 26 operates only SubAD1, SubAD2, and MDAC1 and powers down the subsequent stages as in the fourth embodiment in a power down state.

In addition, a digital part subsequent to the encoder may be powered down within a range in which level detection can be performed.

Figure 13:
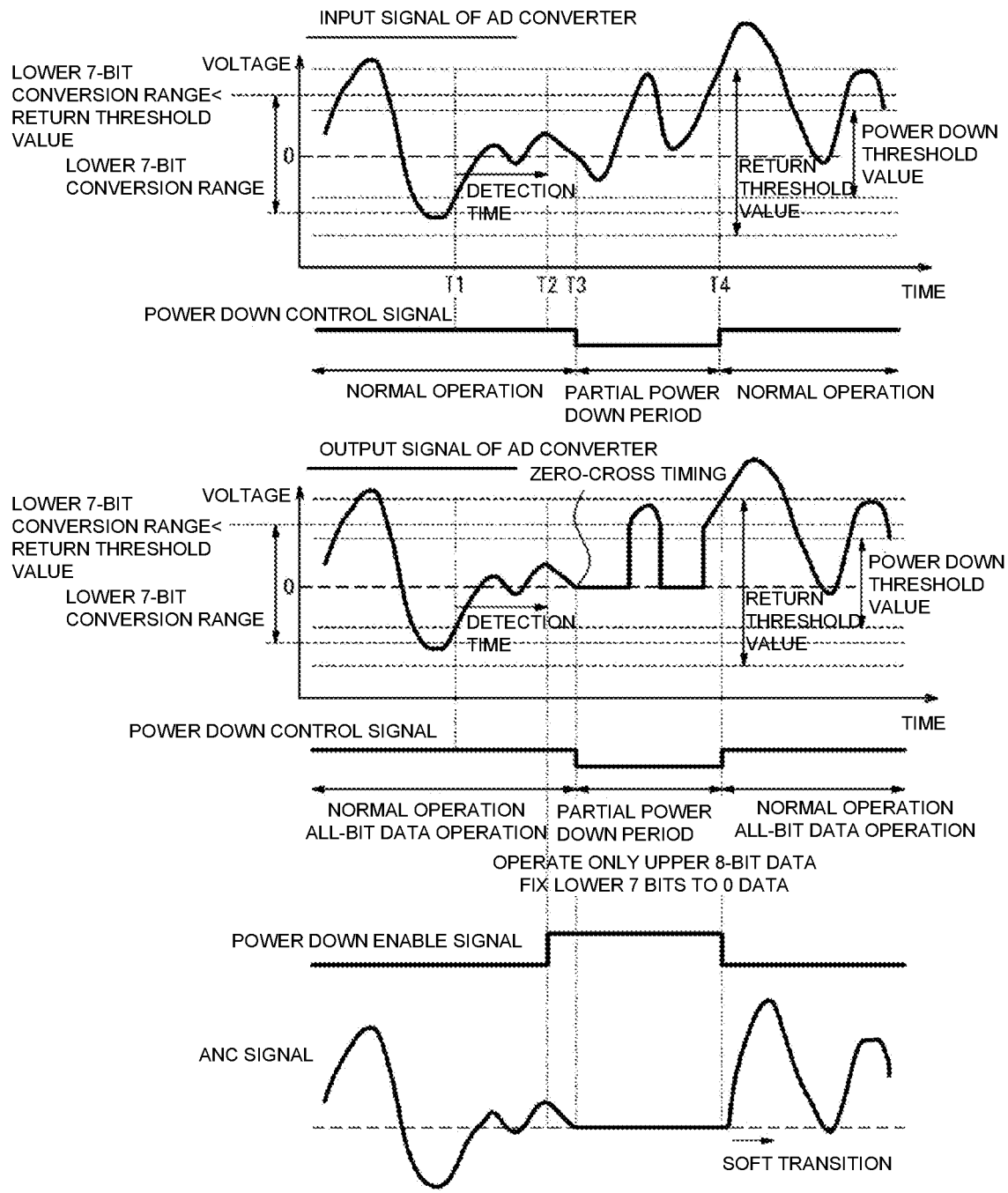
FIG. 13 is a diagram for describing power down control in the ANC system according to the fifth embodiment of the present disclosure.

Power down control of the pipelined AD converter 26 according to the level detector 10E will be described with reference to FIG. 13. FIG. 13 shows the waveforms of the input signal and the output signal of the pipelined AD converter 26, the power down control signal, the power down enable signal, and the output signal (ANC signal) of the ANC signal generator 27.

(1) Transition from Normal Operation to Power Down Operation of pipelined AD Converter 26

The level comparator 13 compares a signal value provided by the absolute value output circuit 12 with a threshold value selected by the selector 15 according to the power down control signal. Since the power down control signal during the normal operation is "1," the power down threshold value is provided by the selector 15. The level comparator 13 generates "1" when the signal value provided by the absolute value output circuit 12 becomes equal to or less than the power down threshold value at T1 in FIG. 13.

When the output of the level comparator 13 becomes "1," the power down detection time counter 16 starts counting. The power down detection time counter 16 activates the power down enable signal ("1" in the present embodiment) when a counted value reaches a set power down detection time at T2 in FIG. 13.

The zero-cross timing power down generation circuit 17 switches the power down control signal from "1" to "0" at a timing (T3 in FIG. 13) at which the zero-cross signal becomes "1" when the power down enable signal is "1." In the present embodiment, the pipelined AD converter 26 performs the normal operation when the power down control signal is "1" and performs the power down operation when the power down control signal is "0." Accordingly, the pipelined AD converter 26 powers down at T3. Since switching to the power down occurs after the power down detection time, it is possible to suppress the frequent mode switching from the normal operation to the power down operation due to variation of a signal level near a threshold value level of level detection.

(2) Transition from Power Down Operation to Normal Operation of Pipelined AD Converter 26

When the power down control signal becomes "0" and the pipelined AD converter 26 powers down, the return threshold value is provided by the selector 15. The return threshold value is assumed to be greater than the power down threshold value. The level comparator 13 generates "0" when the signal value (absolute value of upper 8 bits among a 15-bit digital output signal of the pipelined AD converter 26) provided by the absolute value output circuit 12 exceeds the return threshold value. When the output of the level comparator 13 becomes "0," the power down detection time counter 16 sets the power down enable signal to "0" and the zero-cross timing power down generation circuit 17 switches the power down control signal from "0" to "1" at T4 in FIG. 13. Accordingly, the pipelined AD converter 26 immediately returns from the power down operation.

As shown in FIG. 13, the ANC signal generator 27 may perform the soft transition (returning to an amplitude equal to or greater than the return threshold value at a set digital volume transition time) on the output signal when the pipelined AD converter 26 returns from the power down operation and switches to the normal operation. Accordingly, it is possible to carry out pop noise countermeasures.

When the soft transition is performed, specifically, the ANC signal generator 27 includes a soft transition counter, a volume coefficient generation circuit, and a multiplier inside thereof. The soft transition counter starts counting when the pipelined AD converter 26 switches to the normal operation. The volume coefficient generation circuit generates a volume coefficient to the multiplier at counting intervals. The multiplier multiplies the output signal of the pipelined AD converter 26 by the volume coefficient to increase the signal level at the counting intervals. When the soft transition counter counts up to a predetermined value, the volume coefficient generation circuit generates a volume coefficient having a gain multiplied by one, and thus the output signal of the pipelined AD converter 26 is directly provided by the ANC signal generator 27.

As described above, in the present embodiment, the zero-cross detector 30 which detects a zero-cross timing of the ANC signal provided by the ANC signal generator is included and the level detector 10E causes the blocks which calculate lower bits in the pipelined AD converter 26 to power down if a zero-cross timing is detected when the value of the output signal of the pipelined AD converter 26 is equal to or less than the threshold value. According to such a configuration, the ANC system 5 can reduce the power consumption and decrease the auditory incompatibility of pop noise or noise variation generated during a transition to the power down operation of the pipelined AD converter 26.

Furthermore, the soft transition controller 40 may perform the soft transition when it returns from the power down operation. Accordingly, the ANC system 5 can reduce the auditory incompatibility of pop noise or noise variation generated during transition from the power down operation to the normal operation of the pipelined AD converter 26.

(Sixth Embodiment)

Figure 14:
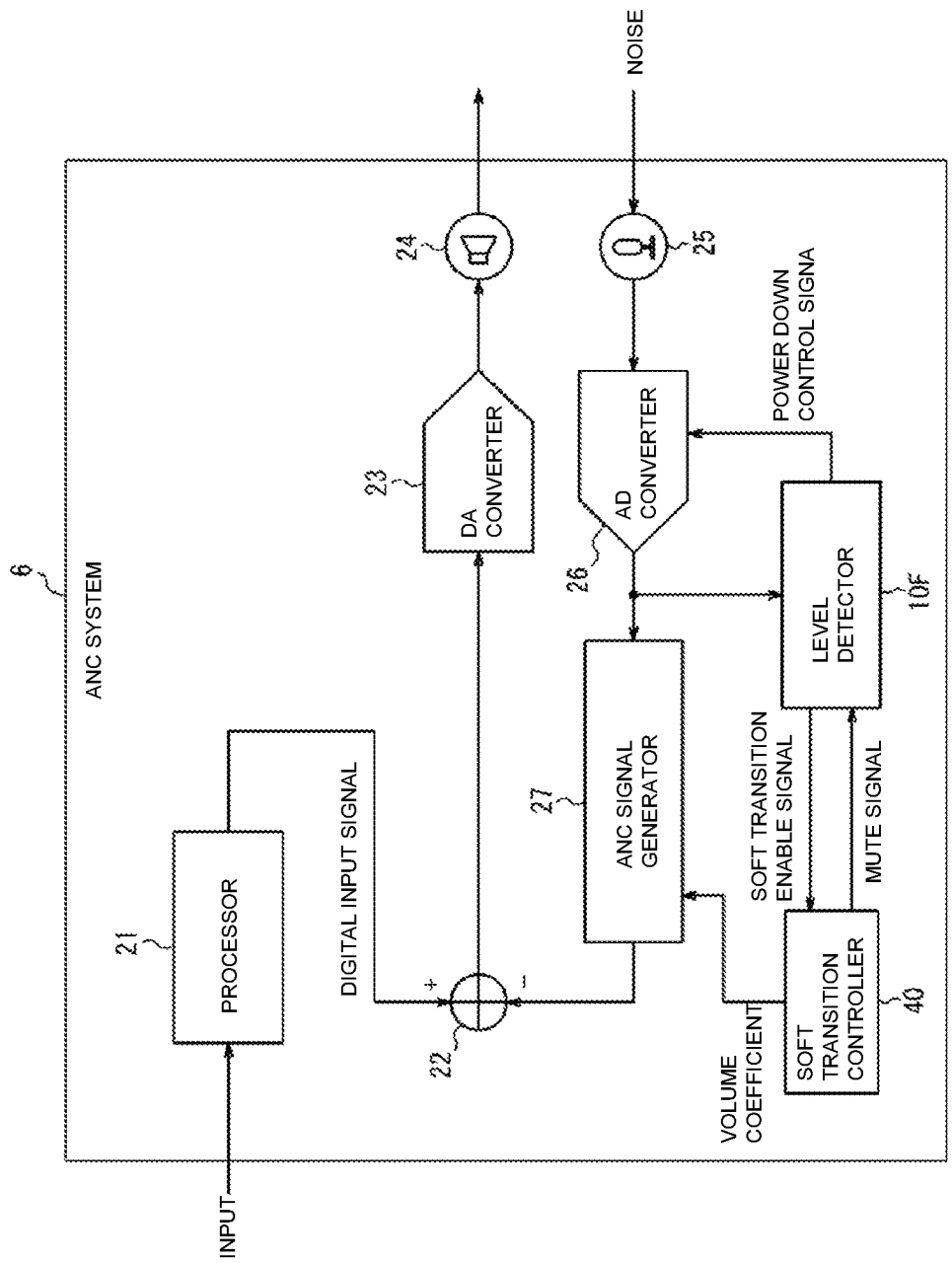
FIG. 14 is a diagram showing a configuration example of an ANC system according to a sixth embodiment of the present disclosure.

Next, an ANC system according to a sixth embodiment of the present disclosure will be described. FIG. 14 is a diagram showing a configuration example of the ANC system according to the sixth embodiment. The ANC system 6 shown in FIG. 14 includes a processor 21, a subtractor 22, a DA converter 23, a speaker 24, a microphone 25, an AD converter 26, an ANC signal generator 27, a level detector 10F, and a soft transition controller 40. The ANC system 6 differs from the ANC system 1 of the first embodiment in that it further includes the soft transition controller 40 and includes the level detector 10F instead of the level detector 10A. Other components are the same as those of the ANC system 1 of the first embodiment and thus are denoted by the same reference numerals and description thereof is appropriately omitted. Meanwhile, the function of the soft transition controller 40 may be realized by the ANC signal generator 27. Further, in the present embodiment, the AD converter 26 is called a pipelined AD converter 26 since the AD converter 26 has the configuration of the pipeline type shown in FIG. 19.

The soft transition controller 40 causes the soft transition of the output signal of the ANC signal generator 27 while gradually changing a volume coefficient and generates a mute signal to the level detector 10F when the output signal has attenuated to "0" (mute). That is, the level detector 10F powers down a portion of blocks of the AD converter 26 when the ANC signal has attenuated to a predetermined level according to the soft transition after a measured time exceeds a predetermined value.

The level detector 10F detects the output signal of the pipelined AD converter 26 and generates a power down control signal to the pipelined AD converter 26. In addition, the level detector 10F generates a soft transition enable signal representing a timing at which the soft transition will be performed to the soft transition controller 40.

Configurations of the level detector 10F and the soft transition controller 40 will be described with reference to FIG. 8 used in the third embodiment.

The soft transition time counter 41 counts up to a predetermined value (soft transition time) when the soft transition enable signal provided by the level detector 10F becomes "1." The soft transition time can be set from the outside of the ANC system 6.

The volume coefficient generation circuit 42 generates a volume coefficient for attenuating the output signal of the ANC signal generator 27 to 0 over the soft transition time and generates the volume coefficient to the ANC signal generator 27 when the soft transition enable signal is "1." The volume coefficient generation circuit 42 updates the volume coefficient at counting intervals such that the output signal of the ANC signal generator 27 attenuates at a specific level.

The ANC signal generator 27 attenuates the output signal by multiplying the output signal of the pipelined AD converter 26 by the volume coefficient provided by the volume coefficient generation circuit 42.

The power down detection time counter 16 performs counting when the output signal of the absolute value output circuit 12 is equal to or less than the power down threshold value and generates a soft transition enable signal that is activated when the counted value becomes equal to or greater than a power down detection time to the mute timing power down generation circuit 18 and the soft transition controller 40.

The mute timing power down generation circuit 18 generates a power down control signal based on the soft transition enable signal provided by the power down detection time counter 16 and the mute signal provided by the soft transition time counter 41 and generates the power down control signal to the pipelined AD converter 26.

When the soft transition enable signal is activated, the mute timing power down generation circuit 18 generates a power down control signal for causing a portion of the pipelined AD converter 26 to power down to the pipelined AD converter 26 when the mute signal is activated. In addition, when the signal value provided by the absolute value output circuit 12 is greater than the return threshold value, the mute timing power down generation circuit 18 generates a power down control signal for causing the pipelined AD converter 26 to return from the power down operation to the pipelined AD converter 26.

The pipelined AD converter 26 operates only SubAD1, SubAD2, and MDAC1 and powers down the subsequent stages in the power down state as in the fourth embodiment. In addition, a digital part subsequent to the encoder may be powered down within a range in which level detection can be performed.

Figure 15:
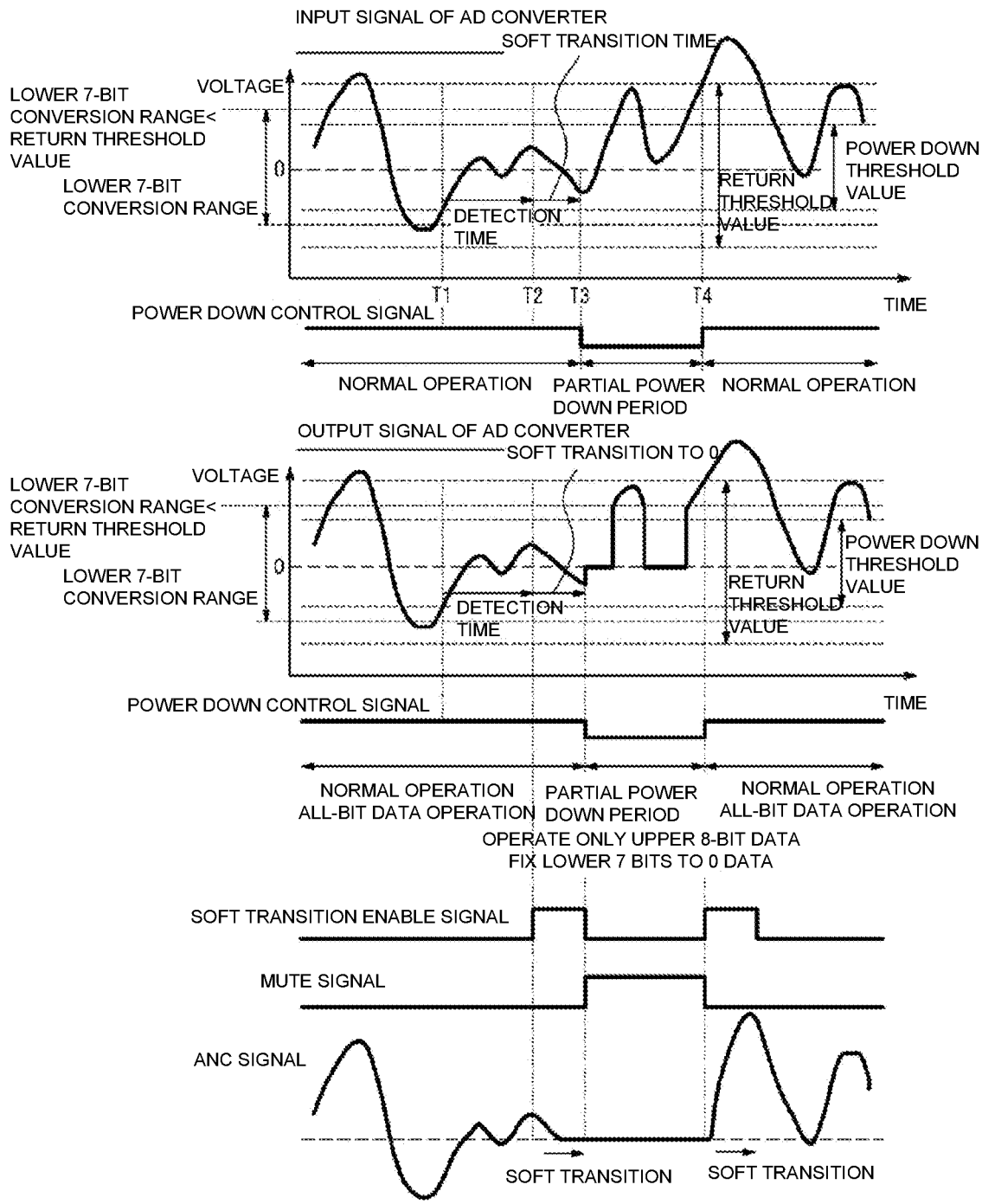
FIG. 15 is a diagram for describing power down control in the ANC system according to the sixth embodiment of the present disclosure.

Power down control of the pipelined AD converter 26 according to the level detector 10F will be described with reference to FIG. 15. FIG. 15 shows the waveforms of the input signal and the output signal of the pipelined AD converter 26, the power down control signal, the power down enable signal, the mute signal, and the output signal (ANC signal) of the ANC signal generator 27.

(1) Transition from Normal Operation to Power Down Operation of Pipelined AD Converter 26

The operation from T1 to T2 in FIG. 15 is the same as that of the fifth embodiment and the soft transition enable signal is activated ("1" in the present embodiment) at T2. Then, the soft transition time counter 41 starts counting at T2. The volume coefficient generation circuit 42 updates the volume coefficient at counting intervals such that the ANC signal provided by the ANC signal generator 27 attenuates at a specific level. The soft transition time counter 41 counts up to a predetermined value (soft transition time) and the ANC signal generator 27 attenuates the signal level according to the volume coefficient. When the soft transition time has elapsed, the mute signal is activated ("1" in the present embodiment) (T3 in FIG. 15).

When the soft transition enable signal is "1," the mute timing power down generation circuit 18 switches the power down control signal from "1" to "0" at a timing at which the mute signal becomes "1." In the present embodiment, the pipelined AD converter 26 performs the normal operation when the power down control signal is "1" and performs the power down operation when the power down control signal is "0." Accordingly, the pipelined AD converter 26 powers down at T3. Since the level detector 10F switches the pipelined AD converter 26 to the power down operation after the power down detection time has elapsed, it is possible to suppress frequent mode switching between the normal operation and the power down operation when the output signal of the pipelined AD converter 26 varies near a threshold value of level detection.

(2) Transition from Power Down Operation to Normal Operation of Pipelined AD Converter 26

The operation of transition from the power down operation to the normal operation of the pipelined AD converter 26 is the same as that of the fifth embodiment and thus description thereof is omitted.

As described above, in the present embodiment, the soft transition controller 40 which causes the soft transition of the output signal of the pipelined AD converter 26 is included and the level detector 10F causes the pipelined AD converter 26 to power down when the output signal of the pipelined AD converter 26 attenuates to 0 according to the soft transition when the value of the output signal of the AD converter 26 is equal to or less than the threshold value. According to such a configuration, the ANC system 6 can reduce the power consumption and decrease the auditory incompatibility of pop noise or noise variation generated during transition to the power down operation of the pipelined AD converter 26.

Furthermore, the soft transition controller 40 may perform the soft transition at the time of returning from the power down operation. Accordingly, the ANC system 6 can reduce the auditory incompatibility of pop noise or noise variation generated during transition from the power down operation to the normal operation of the pipelined AD converter 26.

(Seventh Embodiment)

Figure 20:
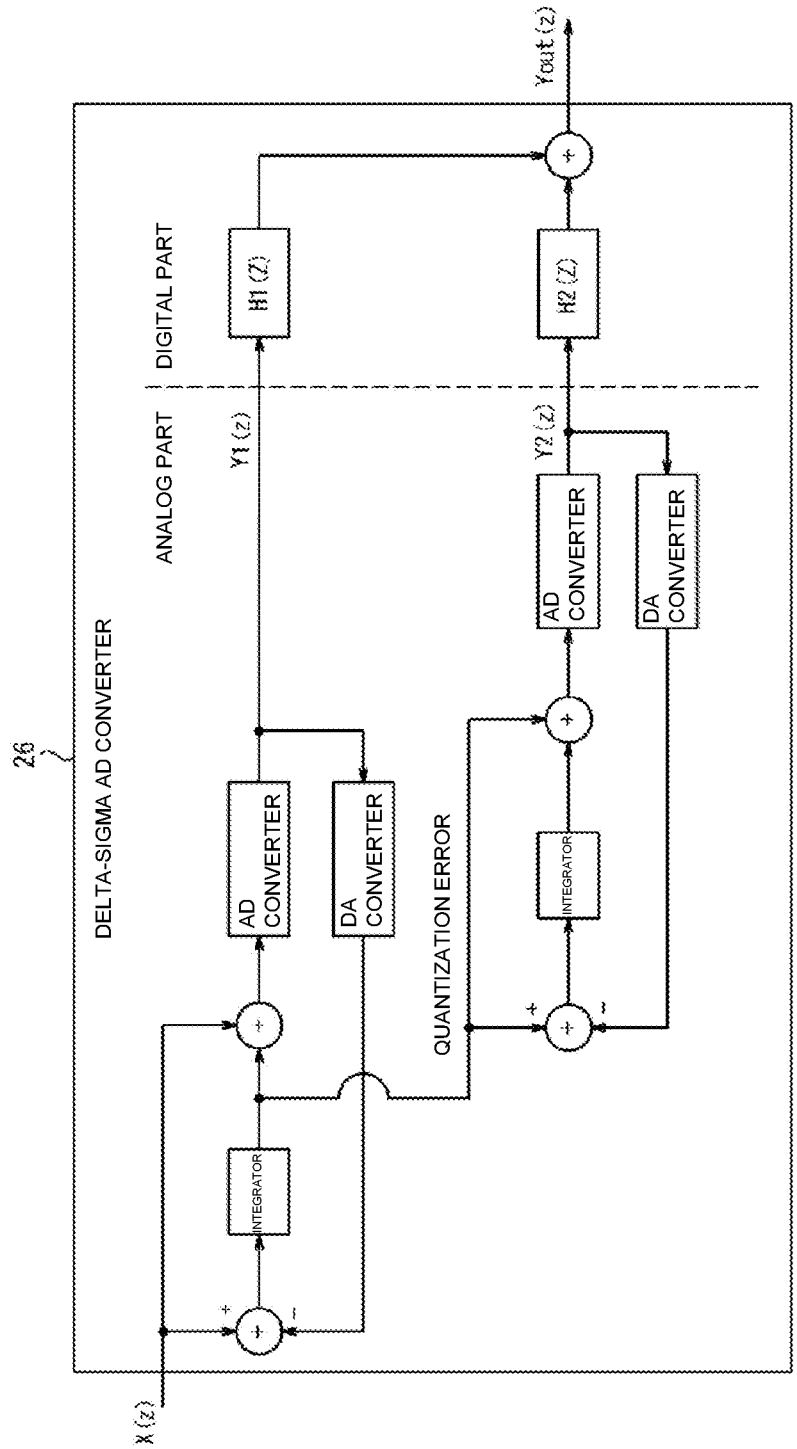
FIG. 20 is a diagram showing a configuration example of a delta-sigma AD converter.

Next, an ANC system according to a seventh embodiment of the present disclosure will be described. Although cases in which the AD converter 26 has the pipeline type configuration have been described in the fourth to sixth embodiments, the AD converter 26 may not have the pipeline type configuration. In the present embodiment, the AD converter 26 is called a delta-sigma AD converter 26 since the AD converter 26 has a two-stage delta-sigma type configuration shown in FIG. 20.

Although a case in which the configuration of the ANC system of the present embodiment is the same as that of the ANC system 5 of the fifth embodiment will be described below, the configuration of the ANC system of the present embodiment may be the same as that of the ANC system 4 of the fourth embodiment or that of the ANC system 6 of the sixth embodiment.

Figure 16:
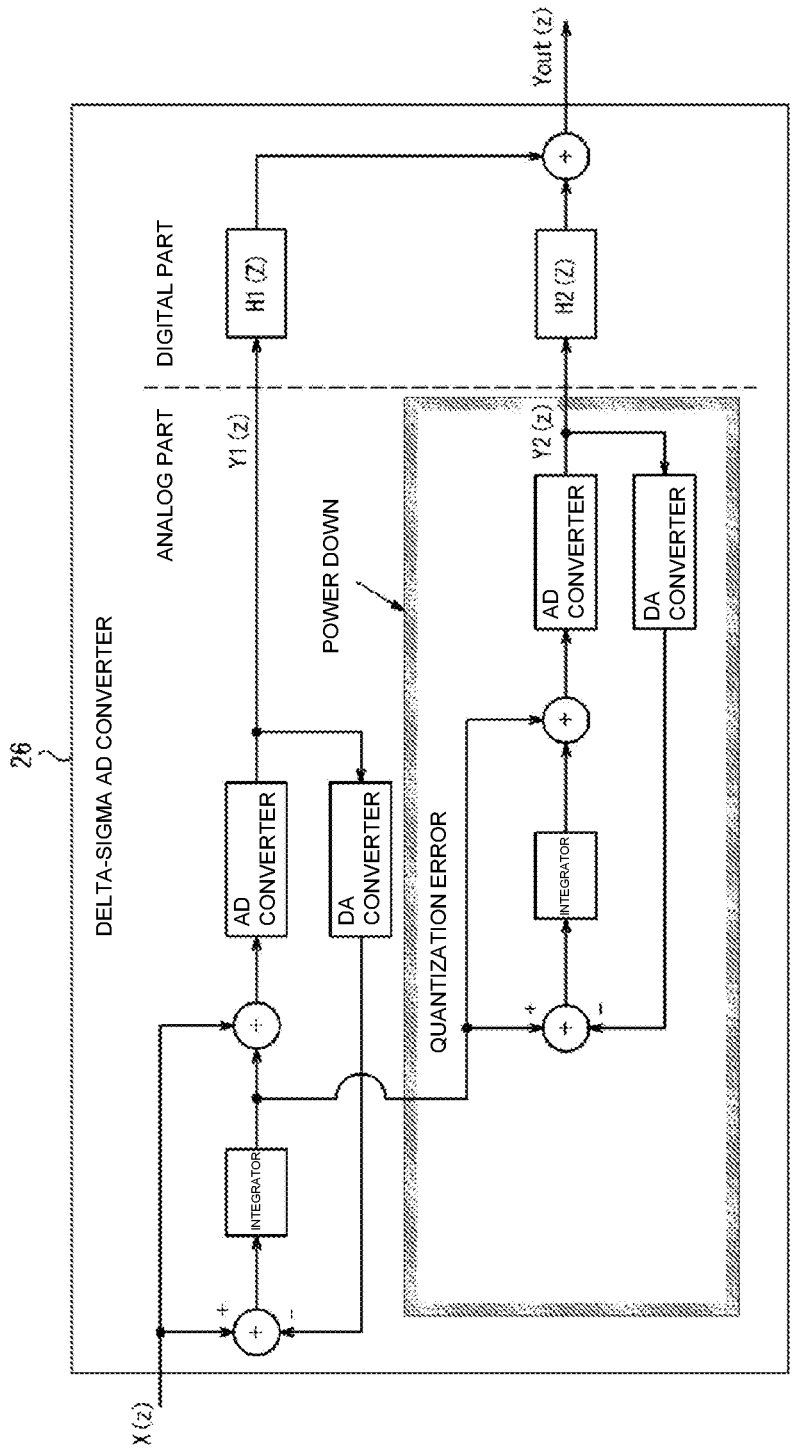
FIG. 16 is a diagram showing a first example of power down of an AD converter in an ANC system according to a seventh embodiment of the present disclosure.

FIG. 16 is a first diagram showing an example of power down of the delta-sigma AD converter 26. In the present embodiment, the delta-sigma AD converter 26 powers down a latter-stage block while suppressing quantization noise according to the noise shaping effect and mitigating SN characteristics of an AD conversion system during power down, as shown in FIG. 16. Although the delta-sigma AD converter 26 having a two-stage MASH configuration is shown in the present embodiment, circuits that form a loop other than the uppermost stage may be powered down in the case of a delta-sigma AD converter 26 having a MASH configuration with three or more stages. When the AD converter 26 is a multi-stage delta-sigma AD converter, a level detector causes a latter-stage block of the multi-stage delta-sigma AD converter to power down after a measured time exceeds a predetermined value.

Figure 17:
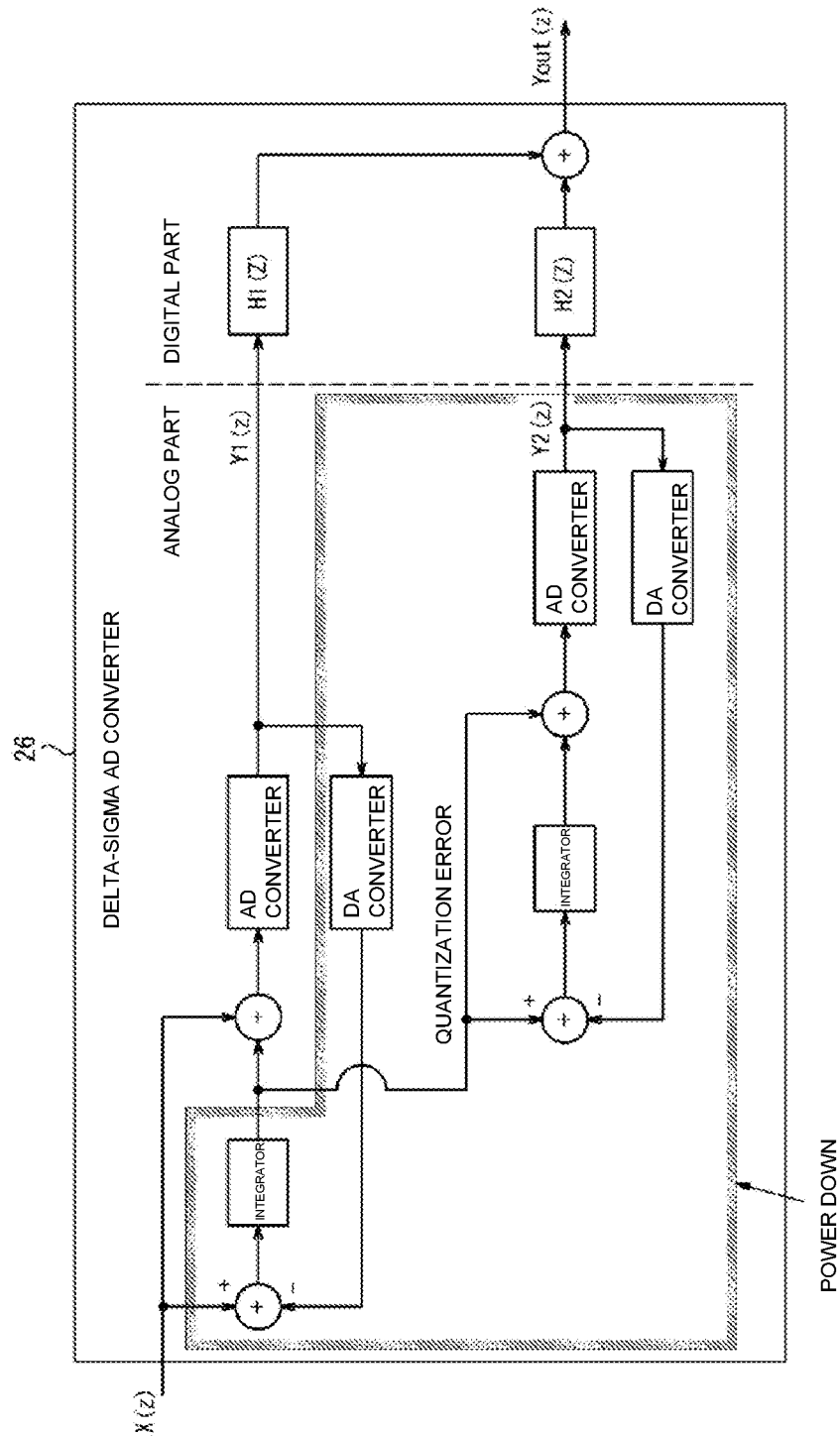
FIG. 17 is a diagram showing a second example of power down of the AD converter in the ANC system according to the seventh embodiment of the present disclosure.

FIG. 17 is a second diagram showing an example of power down of the delta-sigma AD converter 26. The delta-sigma AD converter 26 may power down parts other than a quantizer (AD converter) of a feedforward path of the delta-sigma AD converter during power down, as shown in FIG. 17.

Power down control of the delta-sigma AD converter 26 will be described with reference to FIG. 6 used in the second embodiment.

(1) Transition from Normal Operation to Power Down Operation of Delta-Sigma AD Converter 26

The level comparator 13 compares a signal value provided by the absolute value output circuit 12 with a threshold value selected by the selector 15 according to a power down control signal. Since the power down control signal during the normal operation is "1," the power down threshold value is provided by the selector 15. The level comparator 13 generates "1" when the signal value provided by the absolute value output circuit 12 becomes equal to or less than the power down threshold value.

When the output of the level comparator 13 becomes "1," the power down detection time counter 16 starts counting. The power down detection time counter 16 activates the power down enable signal ("1" in the present embodiment) when a counted value reaches a set power down detection time.

The zero-cross timing power down generation circuit 17 switches the power down control signal from "1" to "0" at a timing (T3 in FIG. 6) at which the zero-cross signal becomes "1" when the power down enable signal is "1." In the present embodiment, the delta-sigma AD converter 26 performs the normal operation when the power down control signal is "1" and performs the power down operation when the power down control signal is "0." Accordingly, the delta-sigma AD converter 26 powers down at T3.

(2) Transition from Power Down Operation to Normal Operation of Delta-Sigma AD Converter 26

When the power down control signal becomes "0" and the delta-sigma AD converter 26 powers down, the return threshold value is provided by the selector 15. The return threshold value is assumed to be greater than the power down threshold value. Since an analog output signal $Y2(z)=0$ during the power down operation of the delta-sigma AD converter 26, a digital output signal $Yout(z)=Y1(z) \times H1(z)$ is established. The level comparator 13 generates "0" when the signal value (the absolute value of $Yout(z)$) provided by the absolute value output circuit 12 exceeds the return threshold value. When the output of the level comparator 13 becomes "0," the power down detection time counter 16 sets the power down enable signal to "0" and the zero-cross timing power down generation circuit 17 switches the power down control signal from "0" to "1." Accordingly, the delta-sigma AD converter 26 immediately returns from the power down operation.

As a technology for reducing power consumption of delta-sigma AD converters, for example, U.S. Pat. No. 6,407,689 discloses a technology for reducing the power consumption by detecting the level of an analog signal at a former stage of an AD converter, selectively enabling a plurality of delta-sigma loops and powering down remaining loops to disable them in a delta-sigma AD converter having a MASH structure. Since this conventional technology enables sufficient delta-sigma loops to realize a necessary dynamic range, an AD converter with lower power consumption is required when the conventional technology is applied to battery driven products such as headphones. In view of this, according to the present embodiment, the delta-sigma AD converter 26 operates only circuit elements necessary at least to return from the power down operation during the power down operation and thus can power down a larger number of circuit elements than that of the conventional delta-sigma AD converter. Furthermore, since an analog signal level detector is not required, an ANC system with low power consumption can be realized.

While the above-described embodiments have been described as typical examples, it will be apparent to those skilled in the art that various modifications and variations can be made to the disclosed embodiments without departing from the scope or spirit of the disclosure. In view of the foregoing, the present invention is not understood to be limited by the above-described embodiments and it is intended that the disclosure covers modifications and variations provided that they fall within the scope of the following claims and their equivalents. For example, a plurality of constituent blocks shown in the configuration diagrams of the embodiments may be combined into one block or one constituent block may be divided.

What is claimed is:

1. An ANC (active noise control) system, comprising:
    an AD (analog-to-digital) converter which performs an AD conversion on an external noise signal;
    an ANC signal generator which generates an ANC signal for canceling a noise component arriving at ears of a user based on an output signal of the AD converter;
    a level detector which detects a level of the output signal of the AD converter and causes the ANC signal generator to power down in response to the level; and
    a zero-cross detector which detects a zero-cross timing of the ANC signal;
    wherein the level detector starts measuring a time when the level is equal to or less than a predetermined first threshold value, and causes the ANC signal generator to perform a power down operation when the zero-cross timing is detected after the measured time exceeds a predetermined value, and causes the ANC signal generator to exit from the power down operation when the level exceeds a predetermined second threshold value.

2. The ANC system according to claim 1, wherein the level detector provides a power-down control signal to cause the ANC signal generator to power down in response to the level, and is provided with the predetermined first threshold value when the power-down control signal indicates the ANC signal generator is in a normal operation and is provided with the predetermined second threshold value when the power-down control signal indicates the ANC signal generator is in a power down status.

3. The ANC system according to claim 1, wherein the level detector comprising:
    a level comparator, configured to compare the level of the output signal of the AD converter with one of the predetermined first threshold value and the predetermined second threshold value;

a power down detection time counter, configured to perform a time counting based on a comparison result of the level comparator and generate a power down enable signal; and a zero-cross timing power-down generation circuit, configured to generate the power-down control signal based on the power down enable signal received from the power down detection time counter and a zero-cross signal received from the zero-cross detector.

4. The ANC system according to claim 1, wherein the predetermined first threshold value is the same as the predetermined second threshold value.

5. The ANC system according to claim 1, wherein the predetermined first threshold value is lower than the predetermined second threshold value.

* * * * *